(12) United States Patent
Ito et al.

(10) Patent No.: US 10,186,422 B2
(45) Date of Patent: Jan. 22, 2019

(54) SUBSTRATE PROCESSING APPARATUS

(71) Applicant: TOKYO ELECTRON LIMITED, Tokyo (JP)

(72) Inventors: Naohide Ito, Oshu (JP); Keiji Osada, Nirasaki (JP); Daisuke Morisawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1168 days.

(21) Appl. No.: 14/060,182

(22) Filed: Oct. 22, 2013

(65) Prior Publication Data

US 2014/0109833 A1 Apr. 24, 2014

(30) Foreign Application Priority Data

Oct. 23, 2012 (JP) .................................. 2012-233980

(51) Int. Cl.
  *H01J 37/32* (2006.01)
  *H01L 21/02* (2006.01)
  *H01L 21/67* (2006.01)

(52) U.S. Cl.
  CPC .. *H01L 21/02617* (2013.01); *H01L 21/67276* (2013.01); *H01J 37/32743* (2013.01); *H01J 37/32899* (2013.01); *H01L 21/67167* (2013.01); *H01L 21/67201* (2013.01)

(58) Field of Classification Search
  USPC ............... 118/719, 729; 156/345.22, 345.23, 156/345.51, 345.54, 345.31, 345.32
  See application file for complete search history.

(56) References Cited

U.S. PATENT DOCUMENTS

| | | | | |
|---|---|---|---|---|
| 5,944,940 | A * | 8/1999 | Toshima | ................ C23C 16/54 118/719 |
| 2005/0247266 | A1* | 11/2005 | Patel | ..................... C23C 16/345 118/719 |
| 2008/0125899 | A1* | 5/2008 | Numakura | ........ H01L 21/67253 700/112 |

(Continued)

FOREIGN PATENT DOCUMENTS

| | | |
|---|---|---|
| JP | 62-132321 A | 6/1987 |
| JP | 2008-124191 A | 5/2008 |

(Continued)

*Primary Examiner* — Jeffrie R Lund
*Assistant Examiner* — Mirza Israr Javed
(74) *Attorney, Agent, or Firm* — Nath, Goldberg & Meyer; Jerald L. Meyer; Joshua B. Goldberg

(57) ABSTRACT

A substrate processing apparatus is provided with a process module including a processing container, a rotary table installed within the processing container, the rotary table having a plurality of placing regions to receive substrates, and a process gas supply unit supplying a process gas to the placing regions, a load port in which a transfer container is placed, a dummy substrate receiving unit, a transfer chamber including a transfer mechanism delivering the product substrates or the dummy substrates between the transfer container or the dummy substrate receiving unit and the rotary table, a setting unit setting a placing region to which one of the product substrates is to be transferred, and a control unit outputting a control signal such that the dummy substrates are carried into the remaining placing regions.

5 Claims, 30 Drawing Sheets

(56) References Cited

U.S. PATENT DOCUMENTS

| | | | |
|---|---|---|---|
| 2009/0229635 A1* | 9/2009 | Numakura | H01L 21/67028 134/18 |
| 2010/0055297 A1* | 3/2010 | Kato | C23C 16/45551 427/8 |
| 2010/0102030 A1* | 4/2010 | Kondoh | H01L 21/67778 216/58 |
| 2010/0280643 A1* | 11/2010 | Mochizuki | H01L 21/67276 700/99 |
| 2012/0156888 A1* | 6/2012 | Sato | C23C 8/36 438/716 |
| 2012/0160805 A1* | 6/2012 | Ehara | H01L 21/67745 216/58 |

FOREIGN PATENT DOCUMENTS

| | | |
|---|---|---|
| JP | 2009-295664 A | 12/2009 |
| JP | 2010-239102 A | 10/2010 |
| JP | 2011-009295 A | 1/2011 |
| JP | 2011-222825 A | 11/2011 |
| JP | 2013-140897 A | 7/2013 |

* cited by examiner

FIG. 7

|      | Product Wafers | Dummy Wafers |
|------|:--:|:--:|
| LP1  | ☑ | ☐ |
| LP2  | ☑ | ☐ |
| LP3  | ☐ | ☑ |

88

SUBSTRATE PROCESSING APPARATUS

CROSS-REFERENCE TO RELATED APPLICATION

This application claims the benefit of Japanese Patent Application No. 2012-233980, filed on Oct. 23, 2012, in the Japan Patent Office, the disclosure of which is incorporated herein in its entirety by reference.

TECHNICAL FIELD

The present disclosure relates to a substrate processing apparatus which processes a plurality of substrates within a processing container while revolving the substrates on a rotary table within the processing container.

BACKGROUND

As an apparatus for forming a thin film, e.g., a silicon oxide ($SiO_2$) film or the like, on a semiconductor wafer (hereinafter referred to as "wafer"), there is known, e.g., a semi-batch-type apparatus. More specifically, a rotary table configured to rotate about a vertical axis within a vacuum container is installed in the apparatus. On the rotary table, recess portions as slots for receiving wafers are formed at a plurality of locations, e.g., five locations, along a circumferential direction.

In between the vacuum container and a load port on which a wafer transfer container (a FOUP: Front-Opening Unified Pod) is placed, a transfer module, a load lock chamber and a loader module are arranged in the named order from the side of the vacuum container. For example, five wafers existing within the FOUP are moved into the vacuum container one after another using transfer arms respectively arranged in the transfer module and the loader module, while intermittently rotating the rotary table. Thereafter, the respective wafers are revolved by the rotary table and a process gas is supplied to the respective wafers, thereby forming thin films on the wafers with increased uniformity.

In this film forming apparatus, there is a demand for evaluation of the properties of a thin film formed in one of the five slots. Although thin films having the same properties are obtained in any of the slots as mentioned above, it is sometimes the case that the reproducibility of the thin film properties is checked with respect to a specific slot. In this case, if film forming processes are equally performed in the remaining four slots other than said one slot, costs are increased just as much as the number of the wafers placed in the remaining four slots. On the other hand, if a film forming process is performed by placing a wafer only in said one slot without placing wafers in the remaining slots, thin films are formed on the bottom surfaces of the remaining slots. This may become a cause of contaminating the rear surfaces of other wafers in a subsequent process or generating particles. In the related art, there is no description on the technology for evaluating the properties of a thin film formed in a specific slot.

SUMMARY

Some embodiments of the present disclosure provide a technology capable of, when a process is performed through the use of a substrate processing apparatus provided with a rotary table in which a plurality of placing regions for the reception of substrates is arranged along a circumferential direction of a processing container, processing a product substrate in arbitrary placing region while suppressing cost escalation and particle generation.

According to one embodiment of the present disclosure, provided is a substrate processing apparatus, including: a process module including a processing container, a rotary table installed within the processing container and configured to rotate about a vertical axis, the rotary table having a plurality of placing regions formed along a circumferential direction thereof so as to receive substrates, and a process gas supply unit configured to supply a process gas to the placing regions so as to process the substrates; a load port in which a transfer container containing product substrates is placed; a dummy substrate receiving unit in which dummy substrates are received; a transfer chamber including a transfer mechanism configured to deliver the product substrates or the dummy substrates between the transfer container on the load port or the dummy substrate receiving unit and the rotary table; a setting unit configured to set a placing region to which at least one of the product substrates contained in the transfer container is to be transferred; and a control unit configured to output a control signal such that the dummy substrates are carried into the remaining placing regions other than the placing region which is set by the setting unit and into which said at least one of the product substrates is to be carried.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a schematic diagram showing one example of a screen displayed on the input unit.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Apparatus Configuration]

One example of a substrate processing apparatus according to an embodiment of the present disclosure will be described with reference to FIGS. 1 to 7. First, the outline of the substrate processing apparatus will be briefly described. The substrate processing apparatus includes process modules 1 each provided with a rotary table in which a plurality of placing regions for the reception of wafers W are arranged at different locations along a circumferential direction of a processing container. Each of the process modules 1 is configured to perform a film forming process with respect to each of the wafers W. In the substrate processing apparatus, during the transfer of wafers W into the processing container, one of product wafers W or dummy wafers W is arbitrarily placed on each of the placing regions. Prior to describing this function in detail, description will be made on the configurations of the substrate processing apparatus and the process modules 1.

Figure 1:
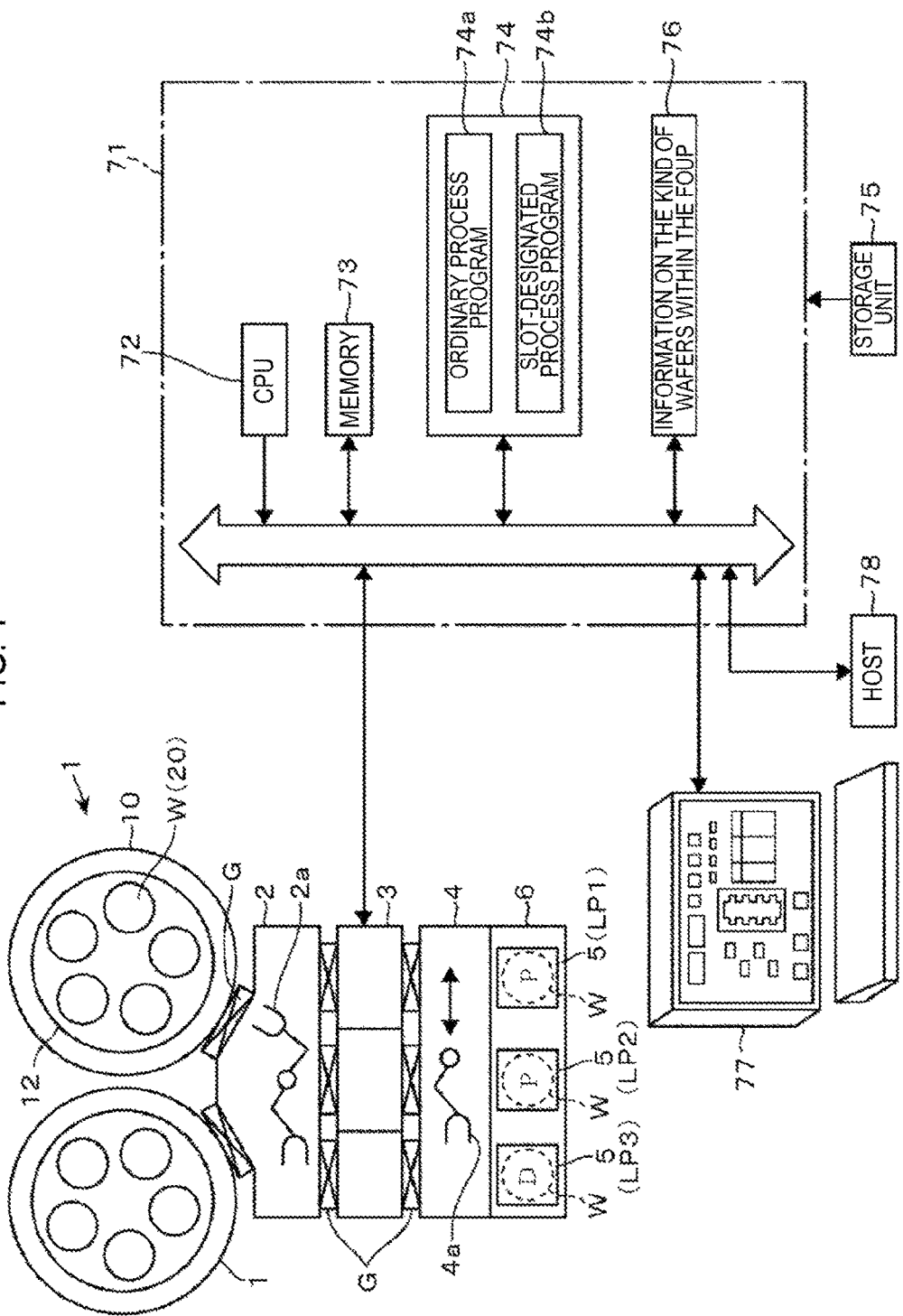
FIG. 1 is a schematic diagram showing a substrate processing apparatus according to the present disclosure.

As shown in FIG. 1, the process modules 1 are arranged side by side in a left-right direction and are installed at two locations. The process modules 1 are identical in configuration with each other. A vacuum transfer chamber 2, the inside of which is kept under a vacuum environment, is positioned in front of the process modules 1 and 1 and is air-tightly connected to the process modules 1 and 1. Two vacuum transfer arms 2a as transfer mechanisms formed of, e.g., articulated arms, are arranged within the vacuum transfer chamber 2 in order to transfer the wafers W. The vacuum transfer chamber 2 and the vacuum transfer arms 2a make up a transfer module. In FIG. 1, reference symbol G designates a gate valve.

Load lock chambers 3 configured to switch the internal pressure between an atmospheric environment and a vacuum environment are air-tightly connected, side by side, to the front side of the vacuum transfer chamber 2 at, e.g., three locations. An atmospheric transfer chamber 4, the inside of which is kept under an atmospheric environment, is connected to the front side of the load lock chambers 3. An atmospheric transfer arm 4a as a transfer mechanism for transferring the wafers W is arranged in the atmospheric transfer chamber 4. The atmospheric transfer chamber 4 and the atmospheric transfer arm 4a make up a loader module.

A load port 6, in which transfer containers (FOUPs) 5 are placed, is arranged at the front side of the atmospheric transfer chamber 4. The load port 6 is configured so that the transfer containers 5 can be placed side by side at, e.g., three locations. The transfer containers 5 containing product wafers W are placed in, e.g., two regions, among three regions of the load port 6 in which the transfer containers 5 are placed. The transfer container 5 containing dummy wafers W is placed in one remaining region of the load port 6.

The three regions (ports) are designated by reference symbols "LP1", "LP2" and "LP3" from right to left. The transfer containers 5 containing the product wafers W and the transfer container 5 containing the dummy wafers W are designated by reference symbols "P" and "D", respectively. In the present example, the transfer containers 5P are arranged in two right ports LP1 and LP2. The transfer container 5D, which forms a dummy wafer receiving unit, is arranged in the left end port LP3. The "product wafers W" are typical wafers W used to form devices when actually manufacturing semiconductor devices. On the other hand, the "dummy wafers W" are wafers W used to prevent the below-mentioned slots 20 from being kept empty when a process is performed without using the product wafers W. Thus, the product wafers W are returned to the transfer containers 5P after undergoing a film forming process and are transferred for the next processing. On the other hand, the dummy wafers W are returned to the transfer container 5D after undergoing a film forming process together with the product wafers W and are sometimes used in the subsequent processing.

Figure 2:
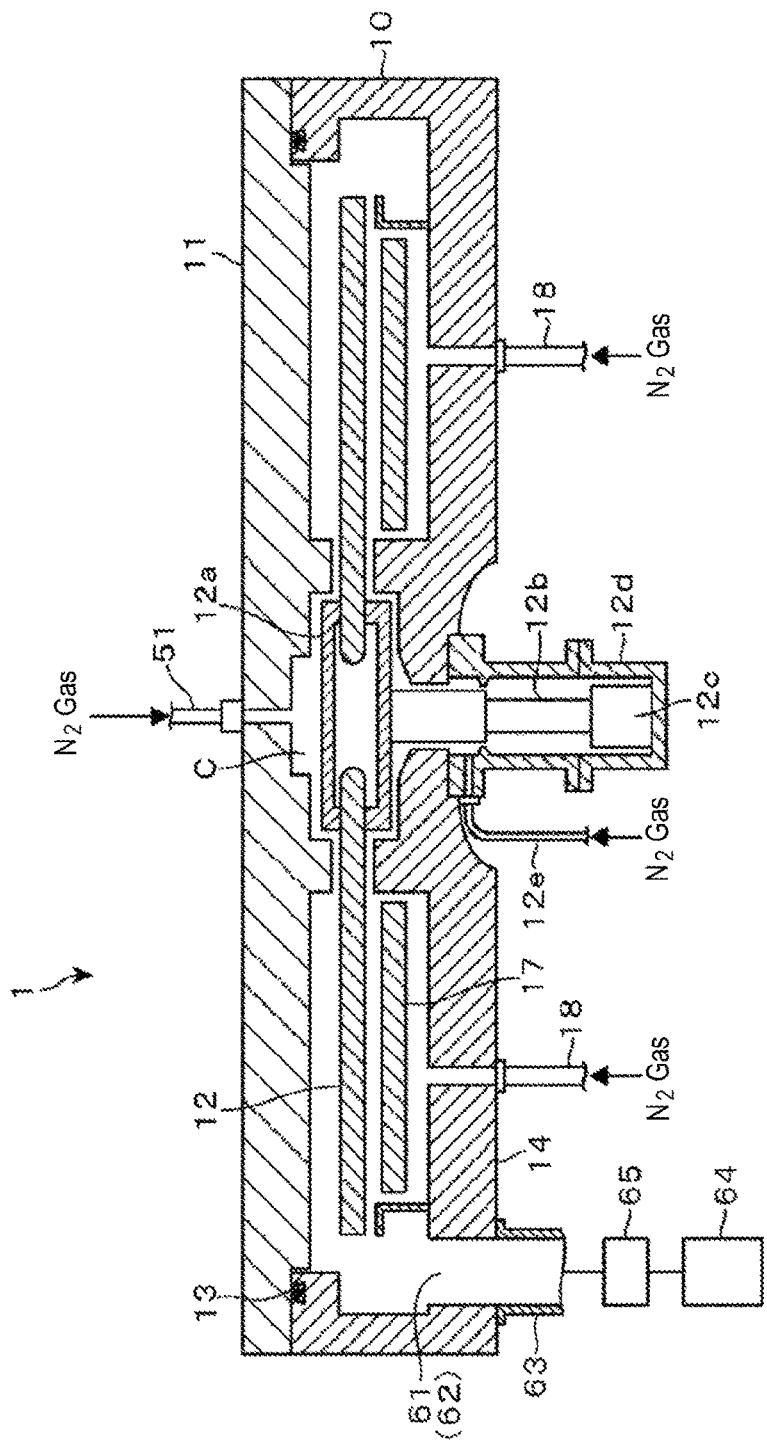
FIG. 2 is a vertical section view showing a process module employed in the substrate processing apparatus.
Figure 3:
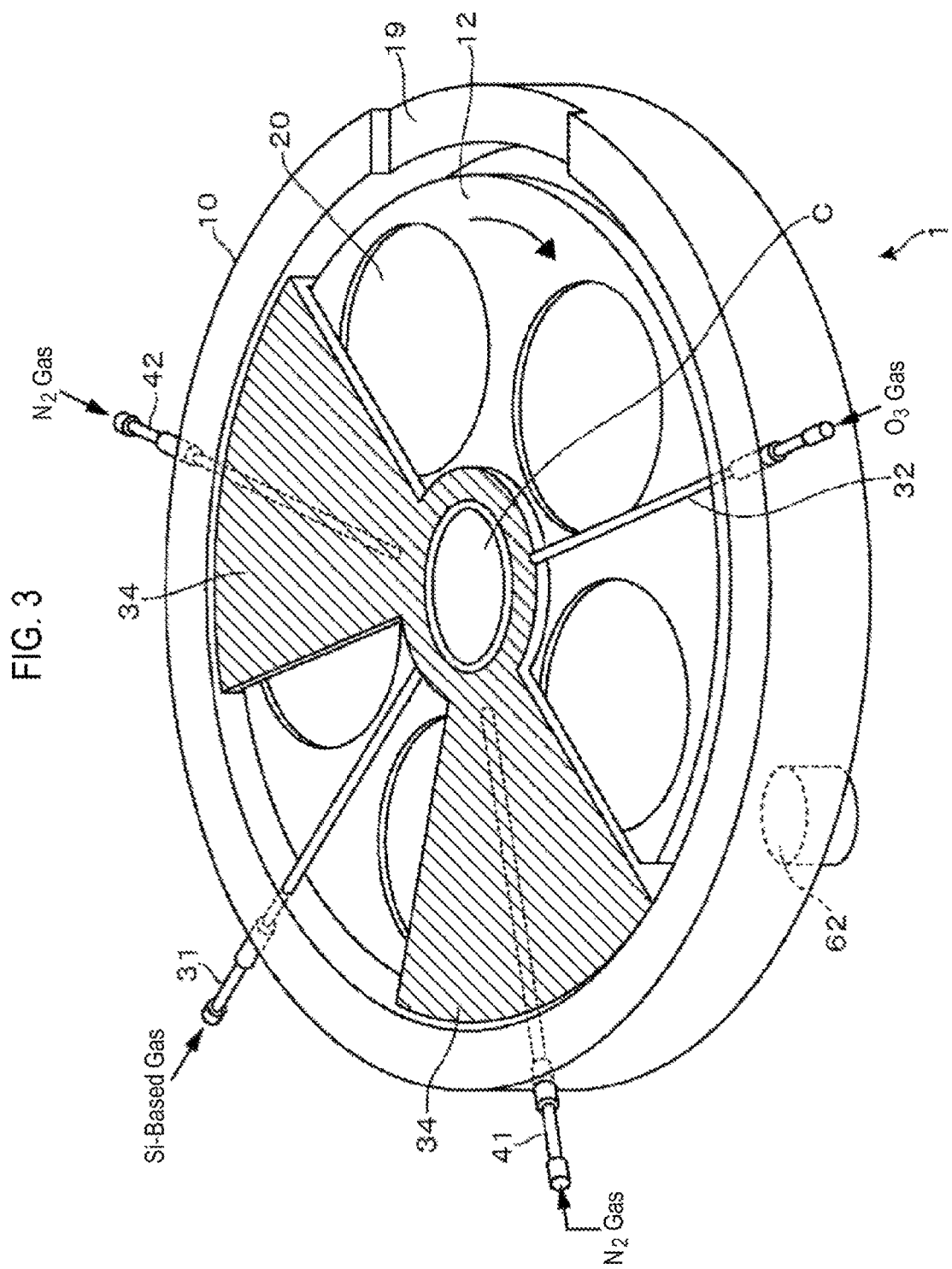
FIG. 3 is a perspective view showing the process module.
Figure 4:
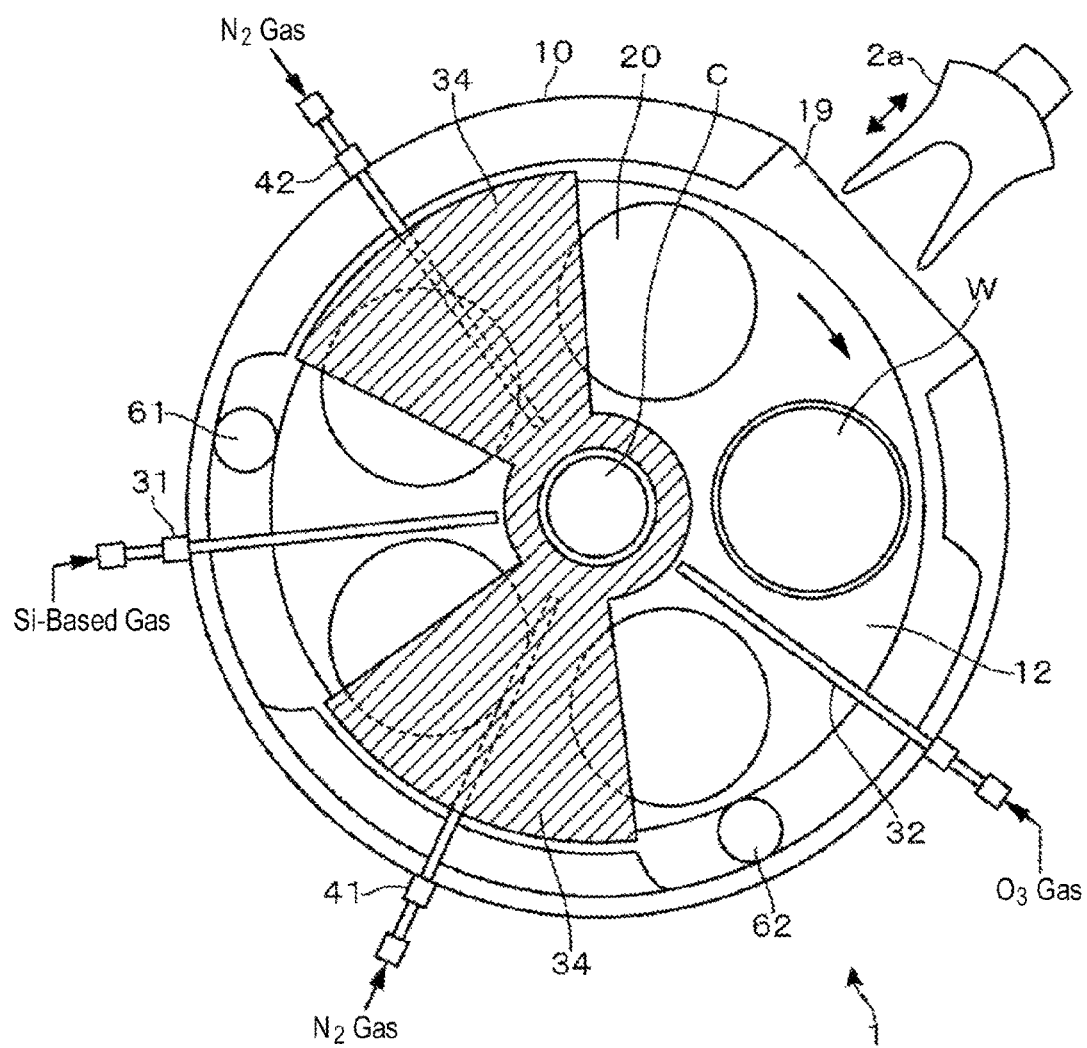
FIG. 4 is a horizontally-cut top view showing the process module.

Next, description will be made on the process module 1. As shown in FIGS. 2 to 4, the process module 1 includes a vacuum container 10 which forms a processing container whose plan-view shape is substantially circular, and a rotary table 12 installed within the vacuum container 10 and having a rotation center coinciding with the center of the vacuum container 10. A separating gas supply pipe 51 configured to supply a nitrogen ($N_2$) gas is connected to an upper central portion of a ceiling plate 11 of the vacuum container 10 in order to restrain different process gases from being mixed with one another in a central region C within the vacuum container 10. In FIG. 2, reference symbol 13 designates a seal member, e.g., an O-ring. Reference symbol 17 designates a heater unit installed between a bottom surface portion 14 of the vacuum container 10 and the rotary table 12. In FIG. 2, reference symbol 18 designates a purge gas supply pipe configured to purge a space within which the heater unit 17 is arranged.

The rotary table 12 is fixed to a substantially cylindrical core portion 12a in the central portion thereof. The rotary table 12 is configured such that it can be rotated about a vertical axis by a rotation shaft 12b connected to a lower surface of the core portion 12a and extending in a vertical direction. In FIG. 2, reference symbol 12c designates a drive unit configured to rotate the rotation shaft 12b about the vertical axis. Reference symbol 12d designates a case configured to receive the rotation shaft 12b and the drive unit 12c. A purge gas supply pipe 12e configured to supply a nitrogen gas as a purge gas to a region below the rotary table 12 is connected to the case 12d.

As shown in FIGS. 2 to 4, circular recess portions as slots (placing regions) 20 are formed on a surface portion of the rotary table 12 in order to receive and hold wafers W. The slots 20 are formed at a plurality of locations, e.g., five locations, along a rotation direction (a circumferential direction) of the rotary table 12. In the positions opposite to transit areas of the slots 20, four nozzles 31, 32, 41 and 42 are radially arranged in a mutually spaced-apart relationship along a circumferential direction of the vacuum container 10. The nozzles 31, 32, 41 and 42 are attached so as to, e.g., horizontally extend from an outer peripheral wall of the vacuum container 10 toward the central region C in an opposing relationship with the wafers W. In the present example, when seen from the below-mentioned transfer gate 19, a second process gas nozzle 32, an separating gas nozzle 41, a first process gas nozzle 31 and a separating gas nozzle 42 are arranged in the named order along a clockwise direction (a rotation direction of the rotary table 12).

Figure 5:
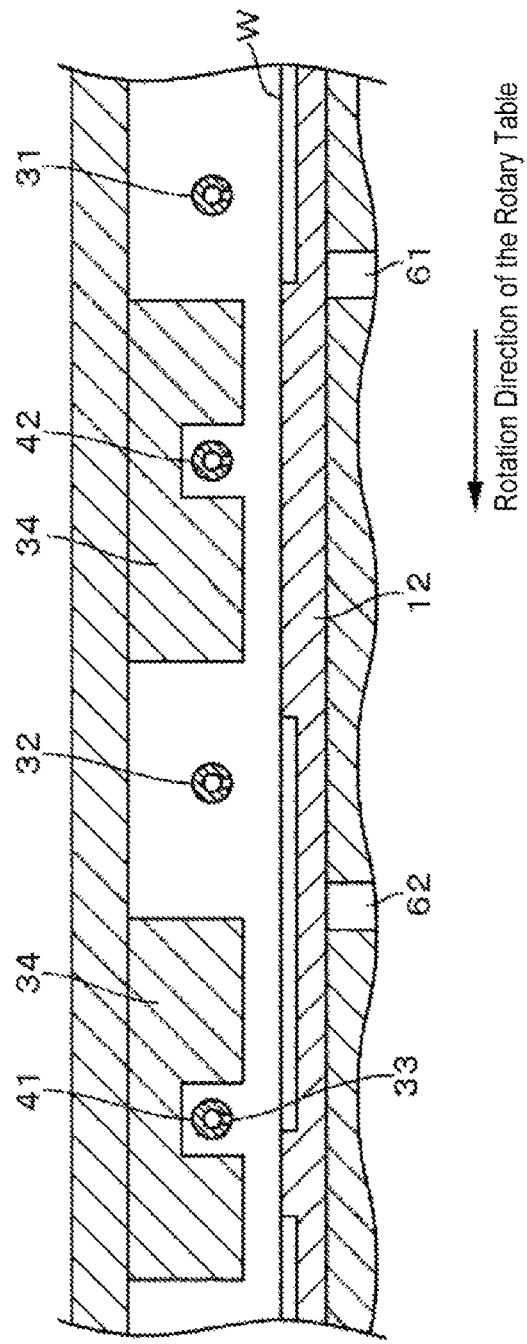
FIG. 5 is a vertical section view showing the process module which is circumferentially cut and developed.

The respective nozzles 31, 32, 41 and 42 are connected to individual gas supply sources (not shown) by way of flow rate regulation valves. That is to say, the first process gas nozzle 31 is connected to a reservoir of a Si-based source gas (e.g., BTBAS: bis(tertiary-butyl-amino)silane). The second process gas nozzle 32 is connected to a reservoir of, e.g., an ozone ($O_3$) gas (specifically, an oxygen ($O_2$) gas source provided with an ozonizer). The separating gas nozzles 41 and 42 are connected to a supply source of a nitrogen gas as a separating gas. On the lower surfaces of the nozzles 31, 32, 41 and 42, as shown in FIG. 5, gas injection holes 33 are formed at a plurality of locations along a radial direction of the rotary table 12. FIG. 5 is a vertical section view showing the vacuum container 10 which is cut along the rotation direction of the rotary table 12 and is developed.

As shown in FIGS. 4 and 5, protrusion portions 34 having a substantially fan-like shape are formed on the ceiling plate 11 of the vacuum container 10 in the regions where the separating gas nozzles 41 and 42 are arranged. The separating gas nozzles 41 and 42 are received within the protrusion portions 34. Low ceiling surfaces as the lower surfaces of the protrusion portions 34 configured to prevent the process gases from being mixed with one another are arranged at the opposite sides of each of the separating gas nozzles 41 and 42 along the circumferential direction of the rotary table 12. High ceiling surfaces higher than the low ceiling surfaces are arranged at the opposite sides of each of the low ceiling surfaces along the circumferential direction.

Two exhaust ports 61 and 62 are formed in a bottom surface portion 14 between the rotary table 12 and the inner wall surface of the vacuum container 10. The exhaust ports 61 and 62 are respectively called a first exhaust port 61 and a second exhaust port 62. The first exhaust port 61 is formed between the first process gas nozzle 31 and the protrusion portion 34 arranged at the downstream side of the first process gas nozzle 31 along the rotation direction of the rotary table 12. The second exhaust port 62 is formed between the second process gas nozzle 32 and the protrusion portion 34 arranged at the downstream side of the second process gas nozzle 32 along the rotation direction of the rotary table 12. As shown in FIG. 2, the first exhaust port 61 and the second exhaust port 62 are connected to a vacuum pump 64 by an exhaust pipe 63 on which a pressure regulation unit 65 such as a butterfly valve or the like is installed.

A transfer gate 19 for the transfer of the wafers W is formed in a portion of the side wall surface of the vacuum container 10, e.g., at the downstream side of the separating gas nozzle 42 along the rotation direction of the rotary table 12 and at the upstream side of the second process gas nozzle 32 along the rotation direction of the rotary table 12. By virtue of the vacuum transfer arms 2a described above, the wafers W are carried into and out of the vacuum container 10 through the transfer gate 19. Lift pins (all of which are not shown) configured to lift up the wafers W from the rear surface side through a through-hole of the rotary table 12 are installed below the rotary table 12 in the positions adjacent to the transfer gate 19.

Description will now be made on the position and operation of the rotary table 12 when the wafers W are carried into the vacuum container 10. As described above, the process module 1 is configured to perform a film forming process while rotating the rotary table 12 about the vertical axis. Thus, the processing uniformity between the wafers W is kept high. For that reason, the properties of thin films obtained after a film forming process are not significantly affected regardless of where a carry-in operation is started from any one of the five slots 20 when the five wafers W are carried into the vacuum container 10.

However, for the purpose of investigating, after the end of the film forming process, the correlation between the properties of the thin films of the respective wafers W and the slots 20 in which the wafers W are processed, there is a need to make it possible to trace which of the slots 20 are used in processing each of the wafers W. Furthermore, it is preferred that, if possible, the order of transfer of the wafers W to the respective slots 20 remains consistent in the respective lots. For that reason, an order is virtually given to the five slots 20. In any of the lots, the wafers W are transferred to the slots 20 in order. In other words, it can be said that an initial position in which to start the carry-in of the wafers W is set with respect to the rotary table 12.

Figure 11:
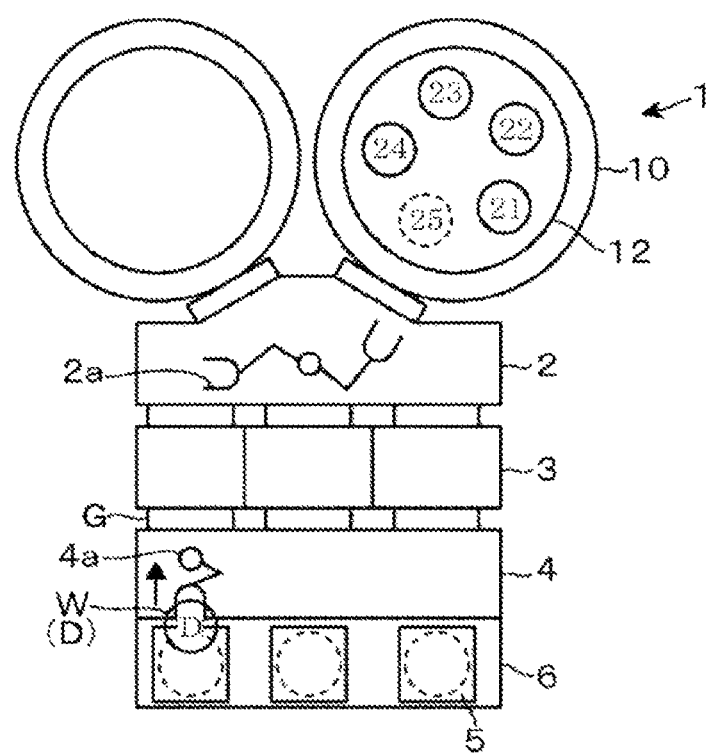
FIG. 11 is a schematic diagram showing an operation of the substrate processing apparatus.

For the sake of simplifying the description made below, serial numbers are virtually given to the five slots 20. More specifically, as shown in FIG. 11 which will be described later, reference symbol "21" is given to the slot 20 located in a position adjacent to the transfer gate 19 when the rotary table 12 is in the initial position. Reference symbol "22" is given to the slot 20 which will be positioned to face the transfer gate 19 when the rotary table 12 is rotated clockwise by 360/5 degrees from the initial position. If reference symbols 21 to 25 are sequentially given to the five slots 20 in this manner, the respective slots 20 are allotted with serial numbers along a direction (a counterclockwise direction) opposite to the rotation direction of the rotary table 12.

If an operation of transferring the wafers W to the slots 21 to 25 is performed in a skipping manner when the wafers W are transferred to the slots 21 to 25, namely if the wafers W are carried into the slot 21 and then into the slot 23, the throughput is reduced just as much as the extra rotation of the rotary table 12. For that reason, when the five wafers W are carried into the vacuum container 10, one of the wafers W is carried into the slot 21 in the initial position and then the remaining wafers W are carried into the slots 22, 23, 24 and 25 in the named order. Thus, even when a film forming process is performed in a "PM slot selection mode" which will be described later, an operation of transferring the wafers W is carried out in the same order as that of the aforementioned ordinary process so that the wafer transfer order and the film forming process can be consistent with the ordinary process as far as possible.

As shown in FIG. 1, a control unit 71 formed of a computer for controlling overall apparatus operations is provided in the aforementioned substrate processing apparatus provided with the process module 1 described above. The control unit 71 includes a CPU 72 and a work-purpose memory 73. In addition, a program 74 configured to perform a film forming process with respect to the wafers W is installed in the control unit 71. The program 74 includes an ordinary process program 74a and a slot-designated process program 74b. The ordinary process program 74a is a program which is used, e.g., when continuously performing a film forming process with respect to a plurality of wafers W. The slot-designated process program 74b is a program which is used when evaluating the properties of a thin film formed on a product wafer W with respect to only an arbitrary slot 20.

If product wafers W are placed in the remaining slots 20 in addition to a specific slot 20 when checking the reproducibility of a film forming process with respect to the specific slot 20, the product wafers W processed in the remaining slots 20 go to waste, which leads to cost escalation. On the other hand, if a film forming process is performed without placing the wafers W in the remaining slots 20, thin films are formed on, e.g., the bottom surfaces of the remaining slots 2 (the surface of the rotary table 12). This may become a cause of contaminating the rear surfaces of other wafers W in a subsequent process or generating particles. Thus, the slot-designated process program 74b is configured to perform a film forming process by placing a product wafer W in a specific slot 20 and placing dummy wafers W in the remaining slots 20. These programs 74a and 74b are composed of process groups so as to perform the below-mentioned apparatus operations and are installed into the control unit 71 from a storage unit 75 as a storage medium, such as a hard disk, a compact disk, a magneto-optical disk, a memory card, a flexible disk or the like.

In order to divisionally use the product wafers W and the dummy wafers W in the aforementioned programs 74a and 74b, a storage region 76 configured to store the information indicating which of the product wafers W and the dummy wafers W are contained in each of the three transfer containers 5 is formed in the aforementioned control unit 71. In the substrate processing apparatus, an input unit 77 formed of a computer including, e.g., a display (a display unit), a keyboard and a mouse (input devices), is installed so as to perform the switching of the programs 74a and 74b and the inputting of the aforementioned information into the storage region 76. The input unit 77 will now be described with reference to FIG. 6 while referring to a screen displayed on the display.

At the upper end of the display, buttons 80 including an "LP1 lot start" button and so on are arranged in the depicted order from the left side to the right side. These buttons 80 can be selected by designating one of the buttons 80 with a mouse pointer on the display and then clicking a mouse button or by directly touching the display with a worker's finger. Other buttons to be described later can be similarly selected by clicking a mouse button or by touching the display with a worker's finger. In the following description, "selecting" the buttons 80 will be sometimes expressed by "pushing" the buttons 80.

The "LP1 lot start" button is a button which is pushed when inputting the necessary information with respect to individual items displayed on the display or when, after selecting a recipe with respect to the wafers W, starting an actual process in which the respective wafers W of the transfer container 5 placed in the port LP1 are processed by the process module 1.

The details of a process performed with respect to the respective wafers W of the transfer container 5 placed in the port LP1 are displayed in the middle area of the display below the respective buttons 80. More specifically, at the left end of the middle area of the display, there is displayed a region 81 in which the numbers corresponding to the receiving positions of, e.g., twenty five wafers W contained within the transfer container 5, are listed from bottom to top. The "receiving positions" are usually called "slots". In order to avoid confusion with the term "slots 20", the term "receiving positions" will be used in the subject specification. When designating the receiving positions, odd numbers are arranged at the right side and even numbers are arranged at the left side in an effort to keep the display region in the up-down direction of the display as narrow as possible.

In a region between the array 82 of odd numbers and the array 83 of even numbers designating the receiving positions of the wafers W, indication windows 84 for displaying the lot number given when a processing lot is selected with respect to the respective wafers W and the number given in the lot selection order are individually formed in a corresponding relationship with the respective wafers W (numbers). In each of the indication windows 84, two digits and one hyphen existing between the two digits are displayed. For example, the first wafer W of lot 1 is displayed to read "1-1". As another example, the third wafer W of lot 5 is displayed to read "5-3". The wafer W for which a lot is not designated (not inputted) is displayed to read "0-0".

Figure 6:
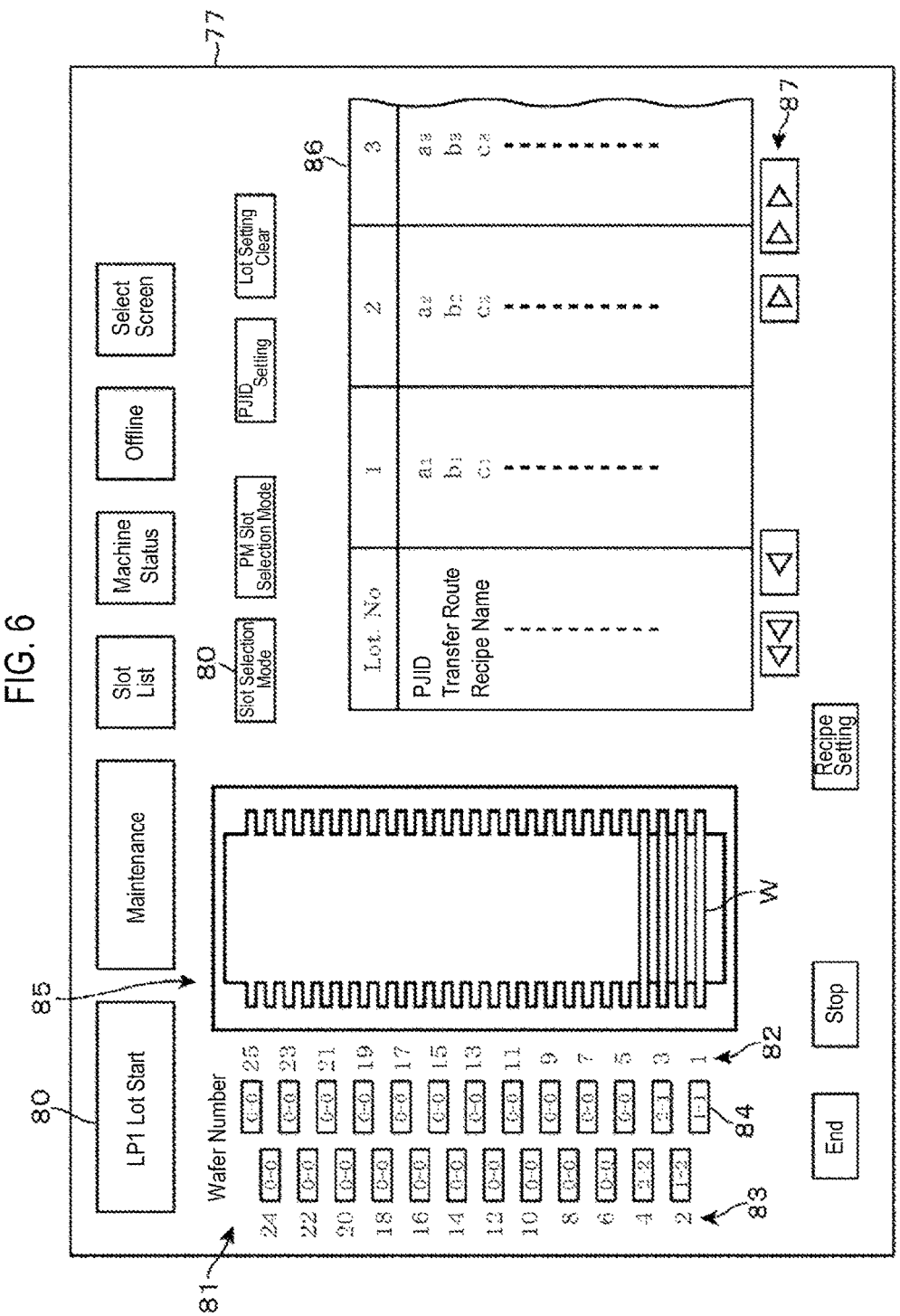
FIG. 6 is a schematic diagram showing an input unit employed in the substrate processing apparatus.
Figure 8:
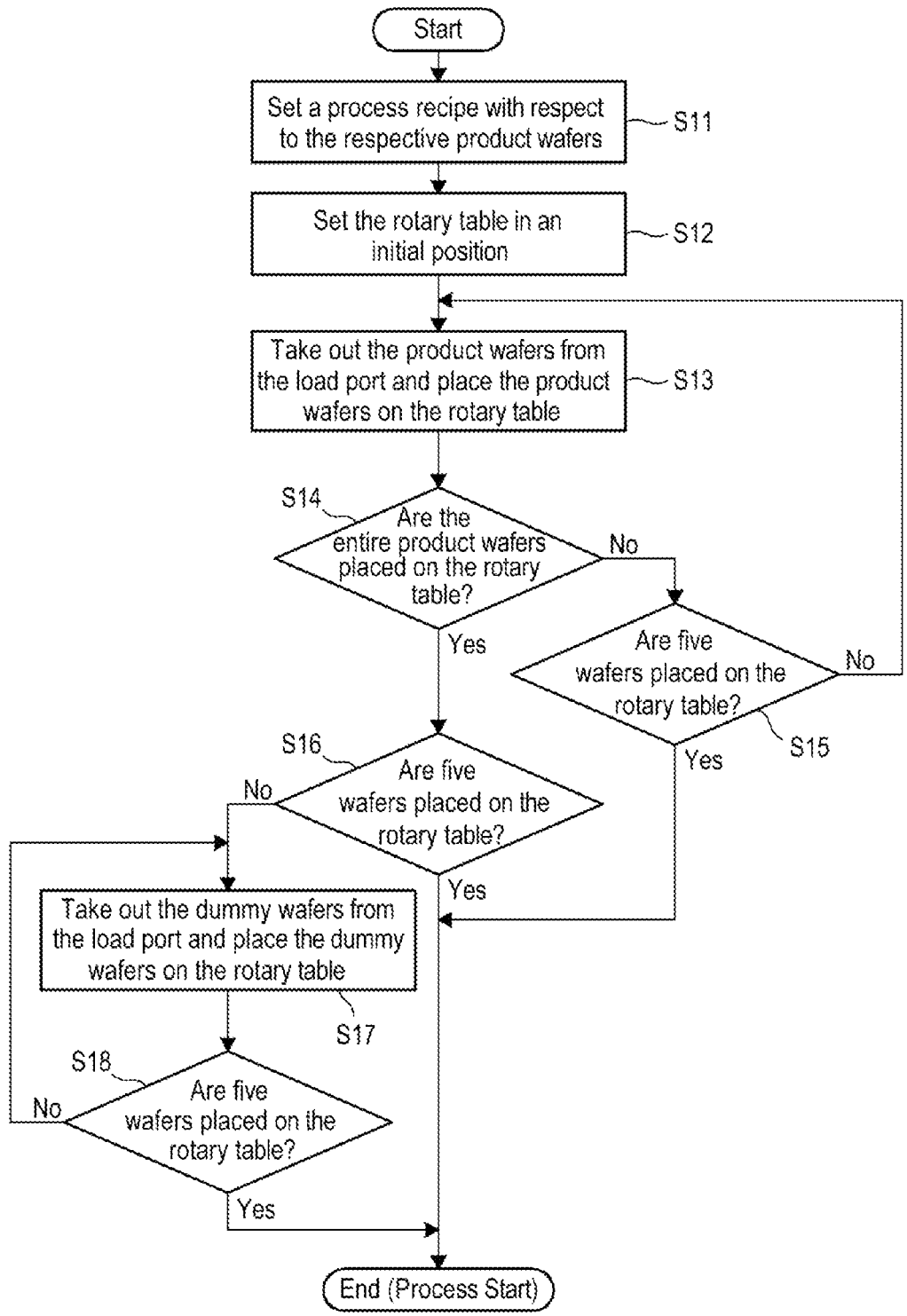
FIG. 8 is a flowchart showing a substrate processing flow in the substrate processing apparatus.

In FIG. 6, the lowermost (first) wafer W is designated by "1-1" which indicates the first wafer of lot 1. The second wafer W from the bottom is designated by "1-2" which indicates the second wafer of lot 1. Likewise, the third wafer W from the bottom is designated by "2-1" which indicates the first wafer of lot 2. The fourth wafer W from the bottom is designated by "2-2" which indicates the second wafer of lot 2. Lots are not designated with respect to the fifth or higher wafers W from the bottom ("0-0"). This means that FIG. 6 shows an interim lot-setting stage in the port LP1. The lot designation method will be described later in more detail. The rear end digit appearing in each of the indication windows 84 is the number indicating the designated lot and has nothing to do with the numbers of the slots 20 which will be described later.

At the right side of the region 81, a schematic diagram 85 schematically showing the side view of the inside of the transfer container 5 is illustrated. In this schematic diagram 85, the respective wafers W are arranged in a corresponding relationship with the indications (the numbers and the indication windows 84) for the respective wafers W appearing in the region 81 at the left side of the schematic diagram 85. With respect to the wafers W for which the aforementioned lot designation is finished, the lot numbers are displayed in the indication windows 84. The images of the wafers W appear in the schematic diagram 85. In FIG. 6, as described above, the lot designation is finished for the four wafers W from the bottom. Therefore, the images of the respective wafers W (the horizontally-extending rod-shaped figures)

are indicated in the schematic diagram 85 in the positions corresponding to the four wafers W.

At the right side of the schematic diagram 85, four buttons 80 including a "slot selection mode" button, a "PM slot selection mode" button, a "PJID setting" button and a "lot setting clear" button, and a recipe table 86 indicating names of the respective lots and the detailed process contents are arranged one above another. The "slot selection mode" button is a button 80 configured to individually designate lots with respect to the wafers W contained in the transfer container 5. The "PM slot selection mode" button is a button 80 which constitutes a setting unit configured to, as will be described later in more detail, set destination slots 20 in addition to the lot setting with respect to the respective wafers W. The "PJID setting" button is a button 80 configured to give names to the respective lots. The "lot setting clear" button is a button 80 configured to clear the setting contents for the lot which is currently set. FIG. 6 shows a state in which the "PM slot selection mode" button is switched off.

At the upper end side of the recipe table 86, the lot numbers, "lot 1", "lot 2", . . . and "lot n" (where n is a natural number), are arranged in the named order from the left side to the right side. If each of the lot numbers is selected (pushed), the content of the relevant lot comes into a selecting state (an editing state). At the lower side of the respective lot numbers, the PJID, the transfer route of the wafer W, the recipe name, and the information indicating which of the two process modules 1 is used to perform a process, are indicated in a corresponding relationship with the respective lot numbers. The "transfer route of the wafer W" is the information indicating, e.g., which of the three load lock chambers 3 is to be used and which of the two vacuum transfer arms 2a is to be used. The "recipe name" is the detailed process content performed in the process module 1. For example, the flow rate of a process gas, the process pressure, the revolution number of the rotary table 12, the process time, the process temperature, or the like is associated with the recipe name. At the lower end of the recipe table 86, scroll buttons 87 are arranged. If one of the scroll buttons 87 is pushed, the lot numbers displayed on the display are shifted to the left or the right.

At the lower end of the display, buttons 80 including an "end" button, a "stop" button and a "recipe setting" button are arranged side by side and are configured to finish or stop a lot setting operation or to specifically edit the recipe.

Figure 7:
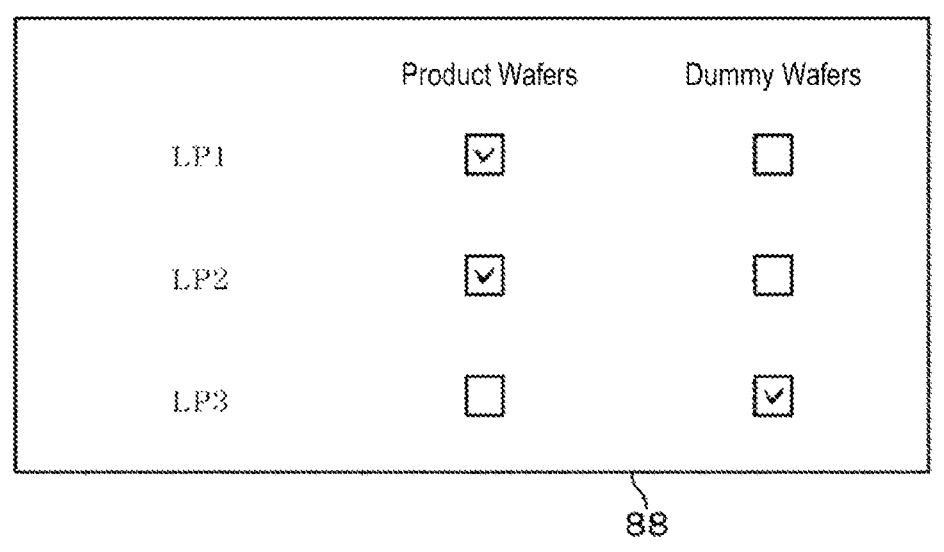

For example, if the aforementioned "select screen" button on the display is pushed, as shown in FIG. 7, a selection screen 88 is displayed for selecting the product wafers W or the dummy wafers W which are contained in the respective transfer containers 5 placed in the respective ports LP1 to LP3. The information selected using the selection screen 88 is stored in the aforementioned storage region 76. Instead of forming the selection screen 88, the substrate processing apparatus may be operated so that the transfer container 5 containing the dummy wafers W is always placed in, e.g., the port LP3.

Control signals are outputted from the aforementioned control unit 71 to the respective parts of the substrate processing apparatus. As shown in FIG. 1, the substrate processing apparatus includes a host computer 78 provided with a display unit and an input device differing from the input unit 77. Just like the control unit 71, the host computer 78 is configured to output control signals to the respective parts of the substrate processing apparatus. The aforementioned input unit 77 is a terminal used by a manufacturer of the substrate processing apparatus. On the other hand, the host computer 78 is a terminal used by a delivery destination to which the substrate processing apparatus is delivered. The display unit of the host computer 78 is configured to display an operation screen just like the input unit 77 described above. The host computer 78 is configured to perform a first transfer mode and a second transfer mode which will be described later. In other words, the host computer 78 is configured to directly set individual items in the program 74 through the control unit 71. From the viewpoint of the delivery destination, the input unit 77 may constitute the host computer 78.

(Operation of the Apparatus During Continuous Processing)

Next, the operation of the aforementioned substrate processing apparatus and the method of setting the recipe in the input unit 77 will be described with reference to FIGS. 8 to 12. First, description will be made on a state in which the "PM slot selection mode" button is switched off, namely a first transfer mode when continuously processing, e.g., the product wafers W (when manufacturing a semiconductor device). Using the selection screen 88 shown in FIG. 7, a setting operation is performed to ensure that, for example, the transfer containers 5 containing the product wafers W are placed in the ports LP1 and LP2 while the transfer container 5 containing the dummy wafers W is placed in the port LP3. The kinds of the wafers W placed in the respective ports LP1 to LP3 may be set before the transfer containers 5 are actually placed in the load port 6 or after the transfer containers 5 are placed in the load port 6.

Subsequently, a process recipe is set with respect to the respective product wafers W of the port LP1 (Process S11). More specifically, if the "lot 1" of the recipe table 86 in FIG. 6 is pushed and if the lowermost wafer W (wafer 1) of the indication windows 84 is pushed, the pushed wafer W is set as lot 1. Then, the second wafer W from the bottom appearing in the indication windows 84 is included into lot 1 in a similar manner. In this way, a plurality of wafers W is sequentially set to become lot 1. The PJID and the detailed recipe content are set in the recipe table 86. In the present example, nine product wafers W are set as lot 1. Similarly, the recipe and the numbers of the wafers W to be processed are set with respect to lot 2 and other subsequent lots. The recipe is similarly set with respect to the respective product wafers W of the port LP2. On the display of the input unit 77, the recipe table 86 and the indication window 84 of the lot under an editing (selecting) operation are displayed in a display color differing from the color of other edited or unedited lots.

Figure 9:
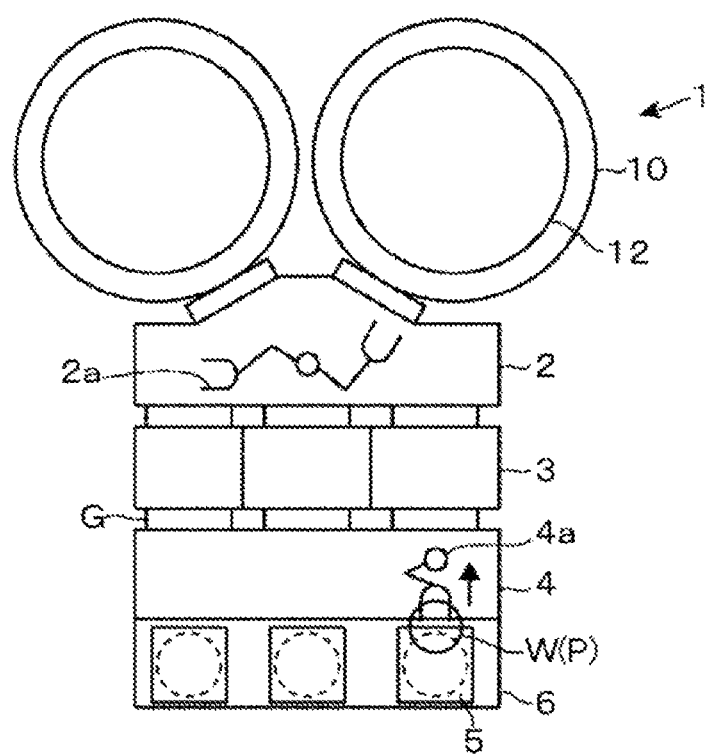
FIG. 9 is a schematic diagram showing an operation of the substrate processing apparatus.
Figure 10:
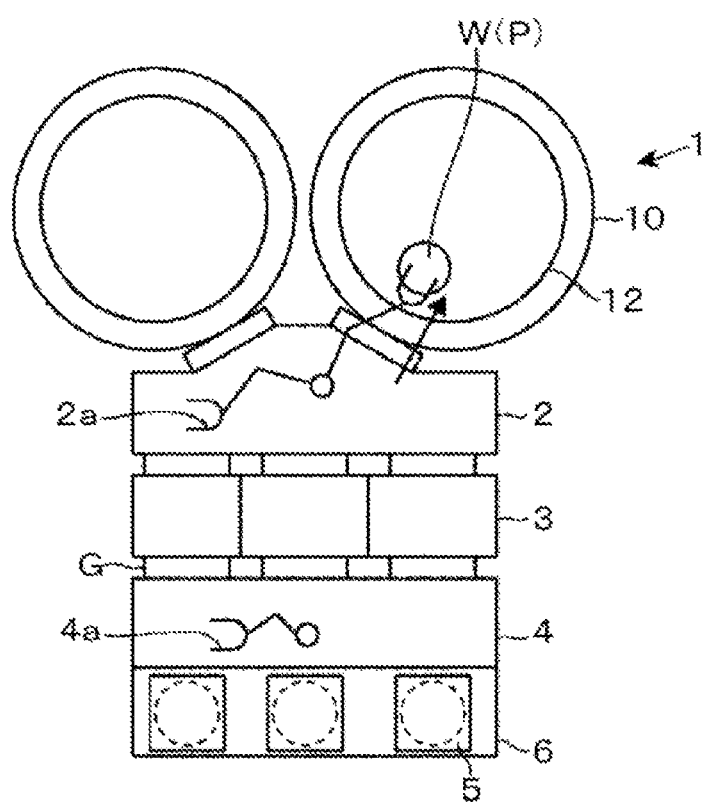
FIG. 10 is a schematic diagram showing an operation of the substrate processing apparatus.

Then, if the "LP1 lot start" button shown in FIG. 6 is pushed, an actual transfer operation and an actual film forming process are started with respect to the respective product wafers W of the port LP1. More specifically, the rotary table 12 is set in the initial position (Process S12). That is to say, the position of the rotary table 12 is set such that the slot 21 among the five slots 21 to 25 faces the transfer gate 19. Subsequently, as shown in FIG. 9, the product wafer W is taken out from the load port 6 (specifically, the port LP1) using the atmospheric transfer arm 4a and is carried into the load lock chamber 3 kept under an atmospheric environment. Then, the load lock chamber 3 is hermetically sealed and the inside of the load lock chambers 3 is vacuum-drawn. Thereafter, the gate valve G located at the side of the vacuum transfer chamber 2 is opened. Then, as shown in FIG. 10, the wafer W is placed in slot 21 of the rotary table 12 of, e.g., the right one of the two process modules 1 and 1 using the vacuum transfer arm 2a (Process S13).

When the carry-in operation of one of the wafers W is finished, non-transferred wafers W are still left in the lot to which the transferred wafer W belongs. Specifically, eight wafers W are still left in the lot 1. Therefore, the remaining wafers W are carried in one after another (Process S14). While intermittently rotating the rotary table 12, the carry-in operation of the wafer W is repeated until five wafers W are placed onto the rotary table 12 (Processes S15 and S16). Subsequently, the vacuum container 10 is hermetically sealed and the inside of the vacuum container 10 is set at a film forming pressure. The wafers W are heated by the heater unit 17 while rotating the rotary table 12 clockwise at a speed of, e.g., from 2 rpm to 240 rpm.

Then, a Si-based gas and an ozone gas are respectively injected from the process gas nozzles 31 and 32. A separating gas is injected from the separating gas nozzles 41 and 42 at a predetermined flow rate. A nitrogen gas is injected from the separating gas supply pipe 51 and the purge gas supply pipe 18 at a predetermined flow rate. If the wafer W on the rotary table 12 reaches a position below the first process gas nozzle 31, a Si-based atomic or molecular layer as an adsorption layer is formed on an exposed surface of the wafer W. If the wafer W having the adsorption layer formed thereon reaches a position below the second process gas nozzle 32, the adsorption layer is oxidized to thereby form a reaction layer. If the rotary table 12 is rotated a plurality of times, multiple reaction layers are laminated on each of the wafers W, thus forming a thin film.

Figure 12:
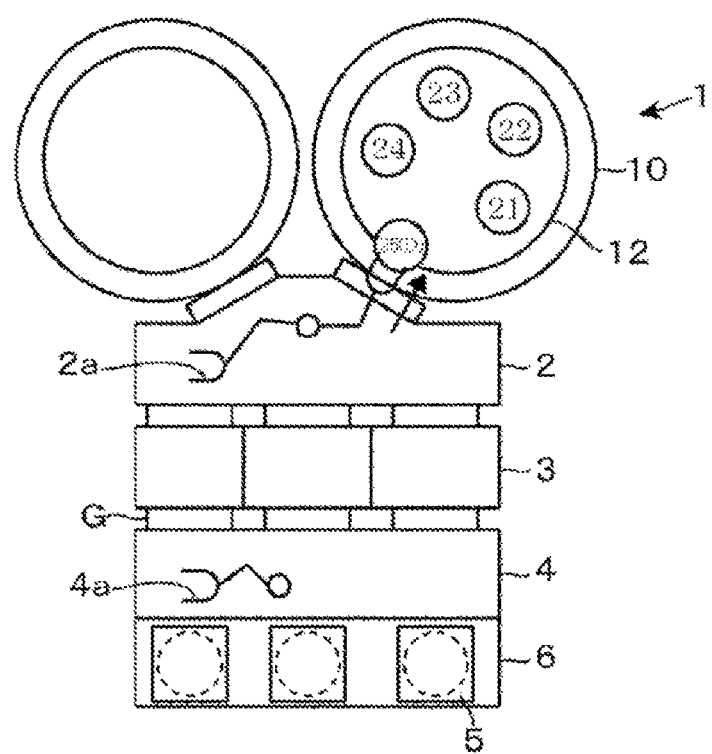
FIG. 12 is a schematic diagram showing an operation of the substrate processing apparatus.

The processed wafers W are returned to the transfer container 5 in the reverse order of the carry-in order. In this way, the processing of the five wafers W among the nine wafers W of lot 1 is finished. Subsequently, the remaining four product wafers W are similarly carried into the vacuum container 10 and are placed in the slots one after another from slot 21. In this case, the fifth slot 25 stays empty (Process S16). If a film forming process is started with slot 25 kept empty, a thin film is formed on the bottom surface of slot 25 as is the case on the surfaces of the wafers W. In that case, when performing a subsequent film forming process, the rear surface of another wafer W makes contact with the thin film formed on the bottom surface of slot 25. Thus, the rear surface of another wafer W may be contaminated or the thin film may be scattered as particles. For that reason, a dummy wafer W is taken out from the port LP3 as shown in FIG. 11 and is placed in slot 25 as illustrated in FIG. 12 (Process S17). In this way, the wafers W are placed in all the five slots 20 (Process S18). A film forming process is started in the same manner as in the foregoing example. Thereafter, similar film forming processes are performed with respect to other subsequent lots.

(Operation of the Apparatus in a PM Slot Selection Mode)

The operation in a second transfer mode when the "PM slot selection mode" button is switched on will now be described with reference to FIGS. 13 to 22. First, description will be made on the reason why the "PM slot selection mode" is set. As mentioned earlier, when conducting a film forming test, it is sometimes the case that the reproducibility of a film forming process is checked with respect to specific slots 20 among the five slots 20. More specifically, there is a case where a film forming process is performed with respect to the product wafers W using only the first slot 21 and the fourth slot 24. In this film forming test, if the film forming process is performed without placing the wafers W in the remaining slots 20 other than the first slot 21 and the fourth slot 24, it is likely that, as set forth earlier, the contamination of the rear surfaces of other wafers W or the generation of particles may occur in the subsequent processes. On the other hand, if the film forming process is performed by placing the product wafers W in the remaining slots 20, costs are escalated just as much as the number of the wafers W placed in the remaining three slots 20.

For the reason noted above, it is preferred in some embodiments that the film forming process be performed by placing dummy wafers W in the remaining slots 20 other than the first slot 21 and the fourth slot 24. In the flow shown in FIG. 8 and described above, however, the dummy wafers W are used only when the number of the product wafers W processed within the vacuum container 10 at one time during the continuous processing of the product wafers W is less than five. Thus, even if an attempt is made to place the product wafers W in the first slot 21 and the fourth slot 24 and to place the dummy wafers W in the remaining slots 20 according to the flow, the product wafers W are placed in the first to fourth slots 21 to 24 and the dummy wafer W is placed only in the fifth slot 25. For that reason, despite the use of the dummy wafers W, costs are escalated in the ordinary film forming flow from the two product wafers W placed in the slots 22 and 23.

In an actual film forming processes where a multiple number of product wafers W are continuously processed within the process module 1, the wafers W are transferred one after another along the circumferential direction of the rotary table 12 from the viewpoint of throughput. Thus, even when a film forming test is performed by placing a product wafer W only in a specific slot 20, the transfer order of the wafers W as well as the film forming conditions need to be interrelated with that of the continuous film forming process. This makes it difficult to employ a method in which the product wafer W is first transferred to the specific slot 20 and then the dummy wafers W are transferred to the remaining slots 20.

Figure 14:
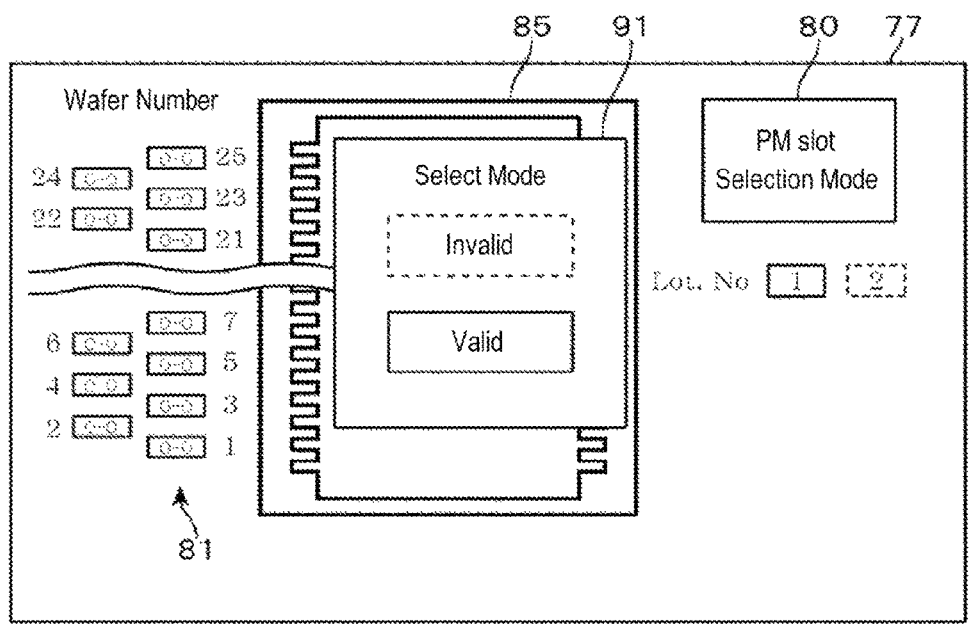
FIG. 14 is a schematic view showing one example of a screen displayed on the input unit.

In the "PM slot selection mode" described below, the wafers W are transferred one after another along the circumferential direction of the rotary table 12. The product wafers W are placed in only the first slot 21 and the fourth slot 24. The dummy wafers W are placed in all the remaining slots 20. In other words, the wafers W are sequentially switched to the product wafer W and the dummy wafer W during time when the wafers W are placed on the rotary table 12 one after another along the circumferential direction of the rotary table 12. That is to say, in the "PM slot selection mode", the destination slots 20 are also designated when the lot and the process recipe described in the foregoing example are initially set with respect to the respective product wafers W (Process S21). More specifically, if the "PM slot selection mode" button is pushed in FIG. 6 described above, a selection window 91 for switching the validity and invalidity of the PM slot selection mode is displayed as shown in FIG. 14. In FIG. 14, the display of the input unit 77 is simplified. This holds true in the subsequent drawings.

Figure 15:
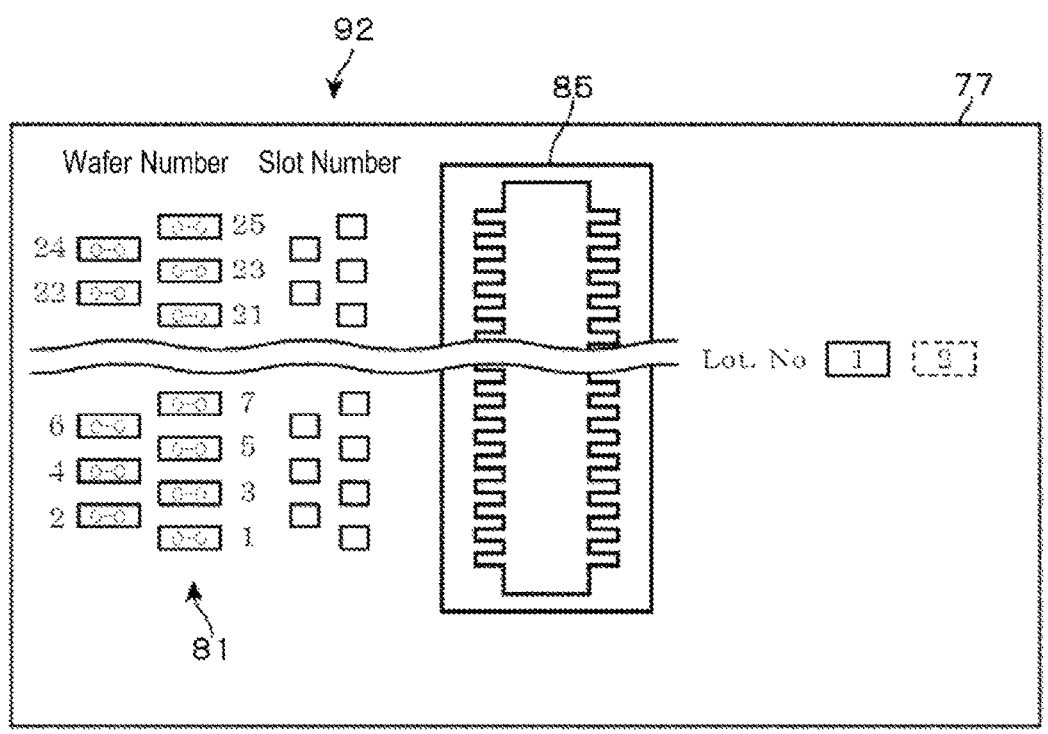
FIG. 15 is a schematic view showing one example of a screen displayed on the input unit.
Figure 16:
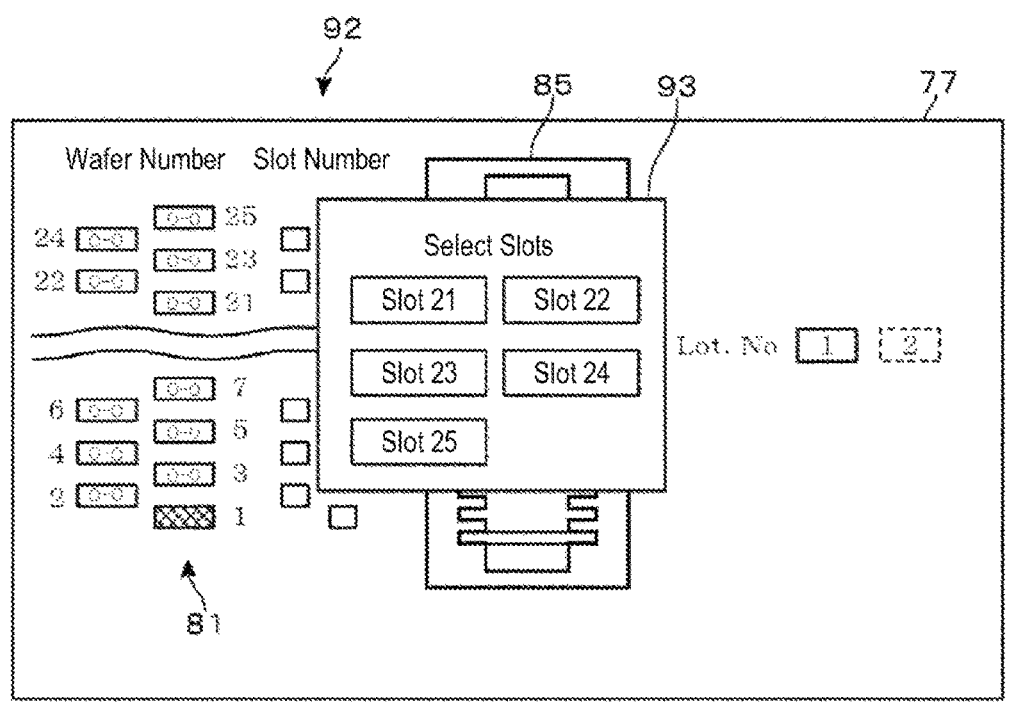
FIG. 16 is a schematic view showing one example of a screen displayed on the input unit.
Figure 17:
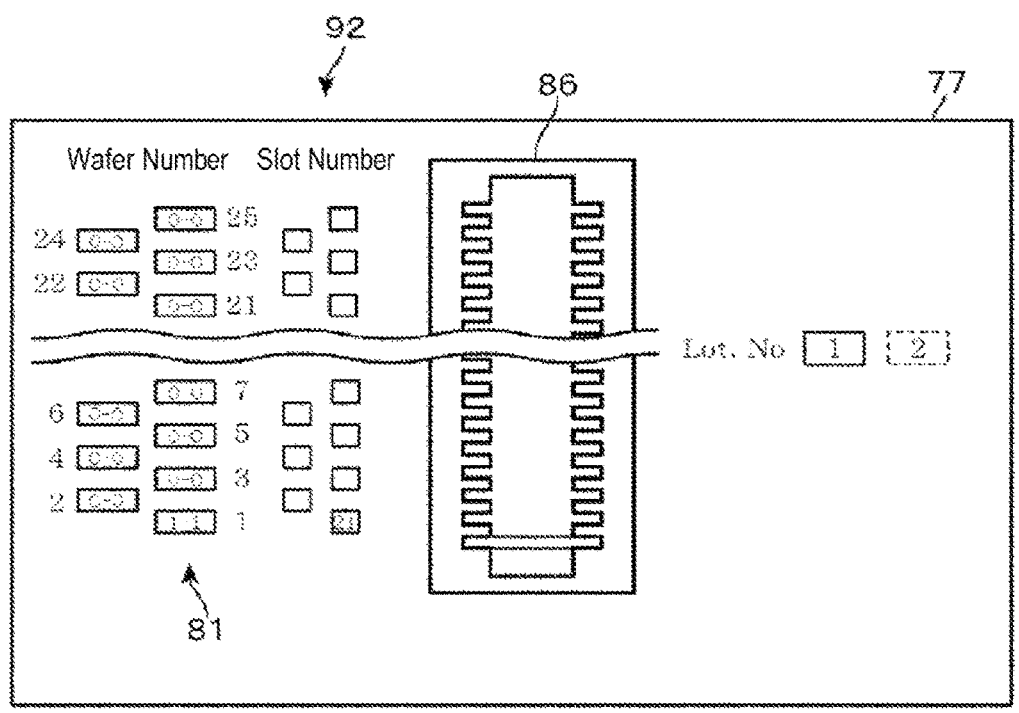
FIG. 17 is a schematic view showing one example of a screen displayed on the input unit.

If an option "valid" is selected in the selection window 91, a slot indication section 92 indicating slot numbers appears between the schematic diagram 85 and the region 81 indicating the receiving position numbers of the respective wafers W in the display of the input unit 77 as shown in FIG. 15. Subsequently, if the lowermost "wafer 1" is selected in the indication windows 84, a slot selection window 93 for enabling a user to select one of the slots 21 to 25 appears as shown in FIG. 16. If "slot 21" is selected in the slot selection window 93, the number "21" is indicated in the region of the slot indication section 92 corresponding to wafer 1 as shown in FIG. 17. That is to say, wafer 1 is interrelated with slot 21 as the destination of wafer 1. In FIG. 16, the selected indication window 84 is hatched.

Figure 18:
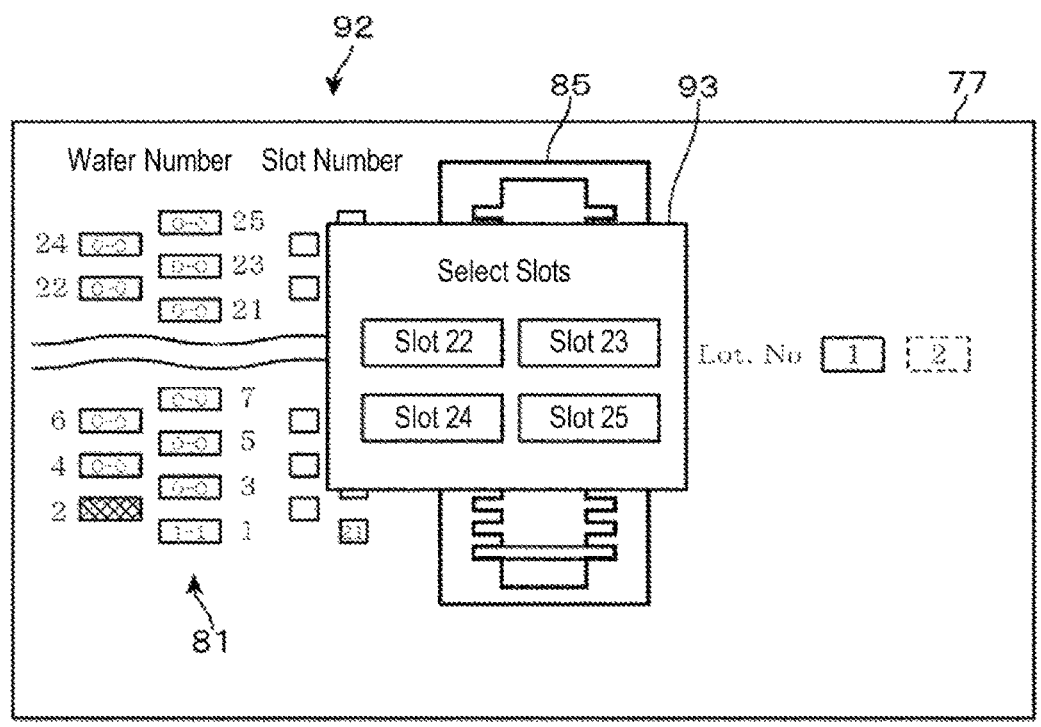
FIG. 18 is a schematic view showing one example of a screen displayed on the input unit.
Figure 19:
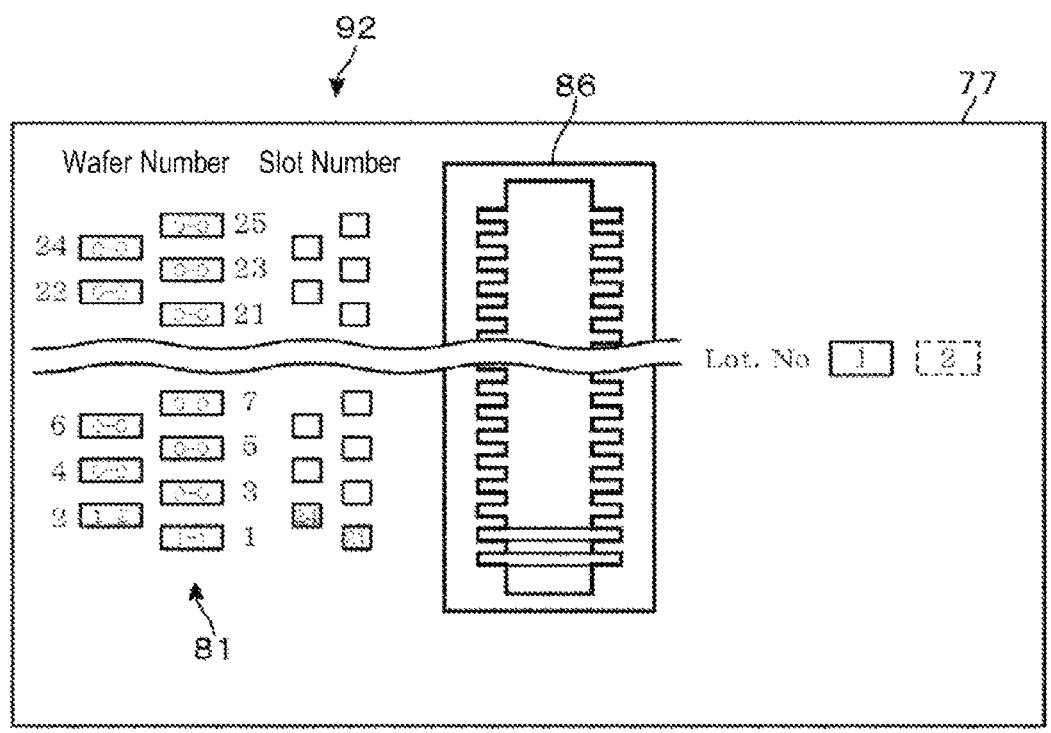
FIG. 19 is a schematic view showing one example of a screen displayed on the input unit.

Subsequently, if the second "wafer 2" from the bottom is selected in a similar manner, a slot selection window 93 appears as shown in FIG. 18. Inasmuch as the selection of slot 21 with respect to wafer 1 has already been finished, slot 21 does not appear in the slot selection window 93. Then, if "slot 24" is selected in the slot selection window 93, the number "24" is indicated in the region of the slot indication section 92 corresponding to wafer 2. In addition, the numbers "1-1" and "1-2" are indicated in the regions of the indication windows 84 corresponding to wafers 1 and 2. Wafers 1 and 2 appear in the schematic diagram 85.

Figure 20:
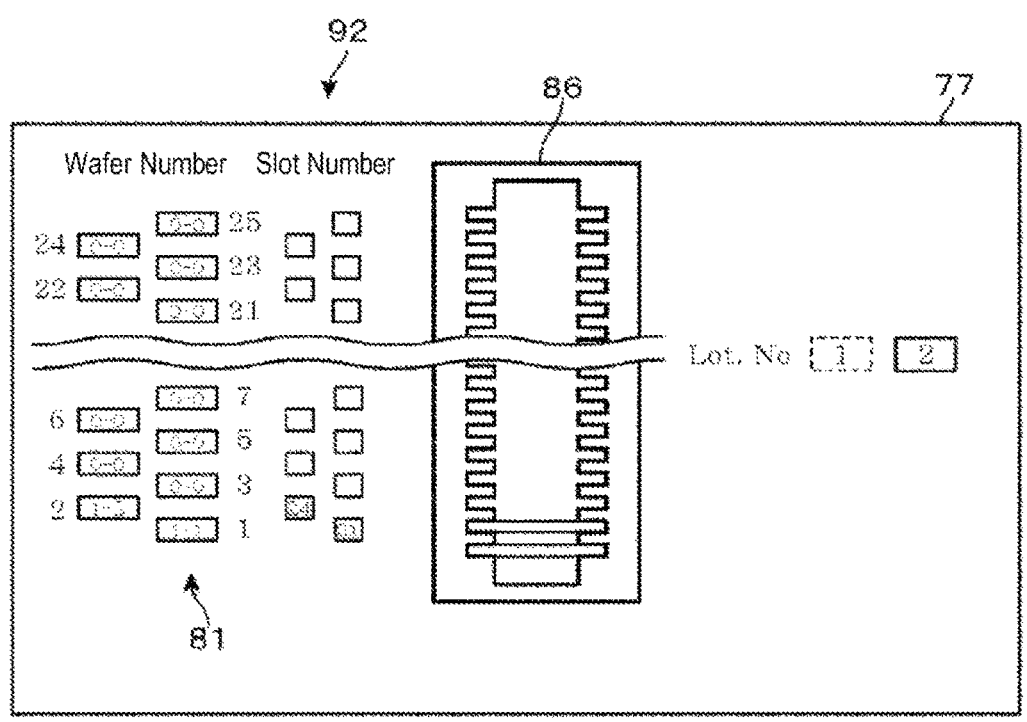
FIG. 20 is a schematic view showing one example of a screen displayed on the input unit.
Figure 21:
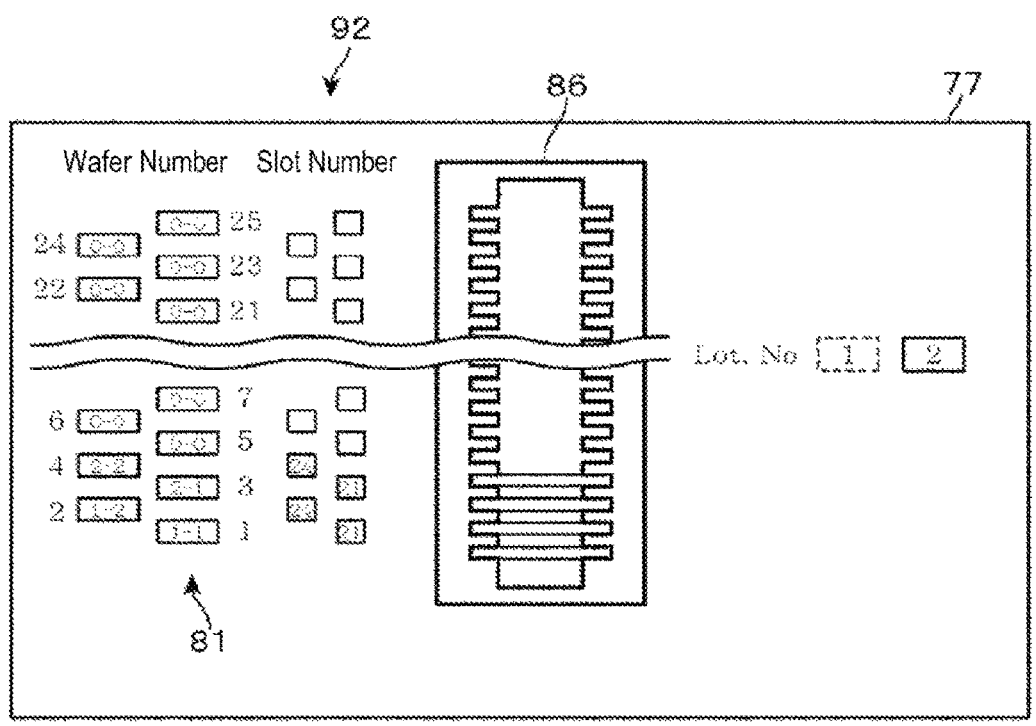
FIG. 21 is a schematic view showing one example of a screen displayed on the input unit.

Subsequent to lot 1 set as above, the same setting is performed with respect to lot 2. More specifically, as shown in FIG. 20, "lot 2" appearing at the upper end side of the recipe table 86 is selected. As shown in FIG. 21, the designation of the slots 21 and 24 mentioned above is performed with respect to the third and fourth wafers 3 and 4 from the bottom. The numbers "2-1" and "2-2" are indicated in the regions of the indication windows 84 corresponding to wafers 3 and 4. Wafers 3 and 4 appear in the schematic diagram 85.

Then, if the "LP1 lot start" button is pushed, as is the case in the foregoing example, the position of the rotary table 12 is set such that the rotary table 12 assumes the initial position, namely such that slot 21 faces the transfer gate 19 (Process S22). At this time, the wafers W have not yet been carried into the rotary table 12 (Process S23) and, hence, determination is made as to whether the product wafer W is designated with respect to the first slot 21 (Process S24). As set forth earlier, the product wafer W is designated with respect to the first slot 21 (Process S25). That is to say, the number "21" is indicated in the region of the slot indication section 92 corresponding to wafer 1. Therefore, as shown in FIG. 9, the product wafer W (wafer 1) is taken out from the port LP1 and is transferred to slot 21 (Process S26).

Figure 22:
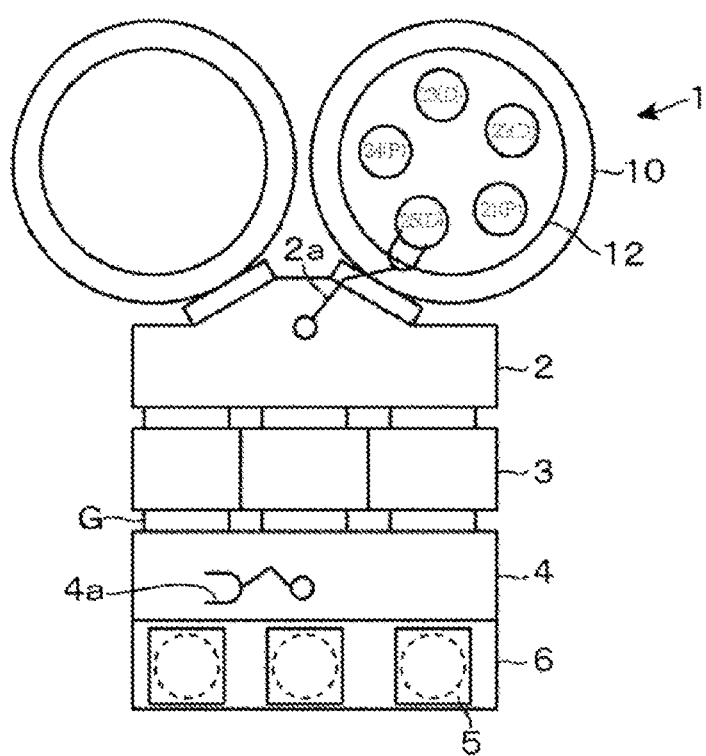
FIG. 22 is a schematic diagram showing an operation of the substrate processing apparatus.

Since the number of wafers W transferred thus far is still one (Processes S24 and S25), the rotary table 12 is rotated such that the next slot 22 faces the transfer gate 19. Inasmuch as the product wafer W is not designated with respect to the second slot 22, the dummy wafer W is taken out from the port LP3 and is placed in slot 22 as shown in FIG. 11 (Process S28). The dummy wafer W is also placed in slot 23 because the product wafer W is not designated with respect to the second slot 23. Since the product wafer W (wafer 2) has already been designated with respect to slot 24, wafer 2 is taken out from the port LP1 and is placed in slot 24. Then, the dummy wafer W is placed in the slot 25 just like the slots 22 and 23. In this way, as shown in FIG. 22, the product wafers W are placed in the slots 21 and 24 and the dummy wafers W are placed in the slots 22, 23 and 25 during the time when the slots 21 to 25 are sequentially positioned to face the transfer gate 19.

After the film forming process is performed with respect to lot 1, the five wafers W are returned to the original transfer containers 5. Then, the same film forming process is performed with respect to lot 2. When designating the slots 20 as the destinations of the product wafers W, if the product wafers W are not received within the transfer container 5 in the positions corresponding to the product wafers W, an error is indicated on the display of the input unit 77 by a mechanism for determining the existence or absence of the wafers W (e.g., a camera or an infrared emitting/receiving unit not shown).

According to the aforementioned embodiment, when the film forming process is performed with respect to the product wafers W only using specific slots 20 among the five slots 20, a setting is made in advance so that the product wafers W are transferred to the specific slots 20 designated for product wafers W while the dummy wafers W are transferred to the remaining slots 20. Furthermore, a determination is made of which of the product wafers W contained in the transfer container 5 are to be transferred to the specific slots 20 designated for product wafers W. Thus, arbitrary product wafers W can be transferred only to the slots 20 designated for product wafers W in which a film forming process need to be performed, while suppressing film formation on the bottom surfaces of the slots 20 not designated for product wafers W. It is therefore possible to suppress unnecessary consumption of the product wafers W (cost escalation).

Use of the PM slot selection mode makes it possible to operate the substrate processing apparatus in the following manner. More specifically, even if there is a need to urgently process the wafers W after a film forming process is continuously performed a multiple number of times and before the maintenance of the apparatus is performed, it is possible to satisfactorily and rapidly perform a film forming process with respect to the wafers W. That is to say, even if, e.g., a film thickness abnormality is found in one of the five slots 20 prior to performing the maintenance, it is possible to perform a film forming process with respect to the wafers W to be urgently processed, while avoiding the slot 20 in which the abnormality is found.

(Other Examples)

Description will now be made on other examples of the present disclosure. FIGS. 23 to 26 show an example in which the dummy wafers W are continuously used. In the example described with respect of FIG. 13 and the like, all the dummy wafers W are placed in the slots 22, 23 and 25 during a first film forming process (for lot 1) and a second film forming process (for lot 2) performed after said one film forming process. As mentioned earlier, the dummy wafers W are used to prevent thin films from being attached to the bottom surfaces of the slots 20. The dummy wafers W may be utilized in a plurality of film forming processes. Since the arrangement locations (the arrangement layouts) of the dummy wafers W remain consistent in the first film forming process and the second film forming process, there is no need to remove the dummy wafers W when starting the second film forming process after finishing the first film forming process. In the aforementioned example, however, if one film forming process comes to an end, the dummy wafers W are first returned to the transfer container 5 of the port LP3. Thereafter, when starting another film forming process, the dummy wafers W or other dummy wafers W are taken out from the transfer container 5 again. In the present example, the dummy wafers W are continuously used.

Figure 23:
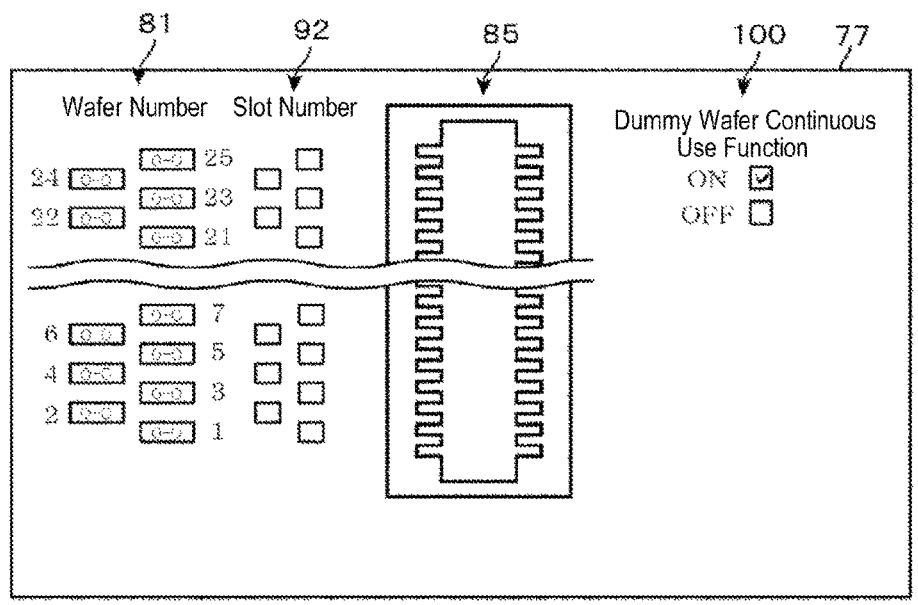
FIG. 23 is a schematic view showing one example of a screen displayed on an input unit in another example of the substrate processing apparatus.
Figure 24:
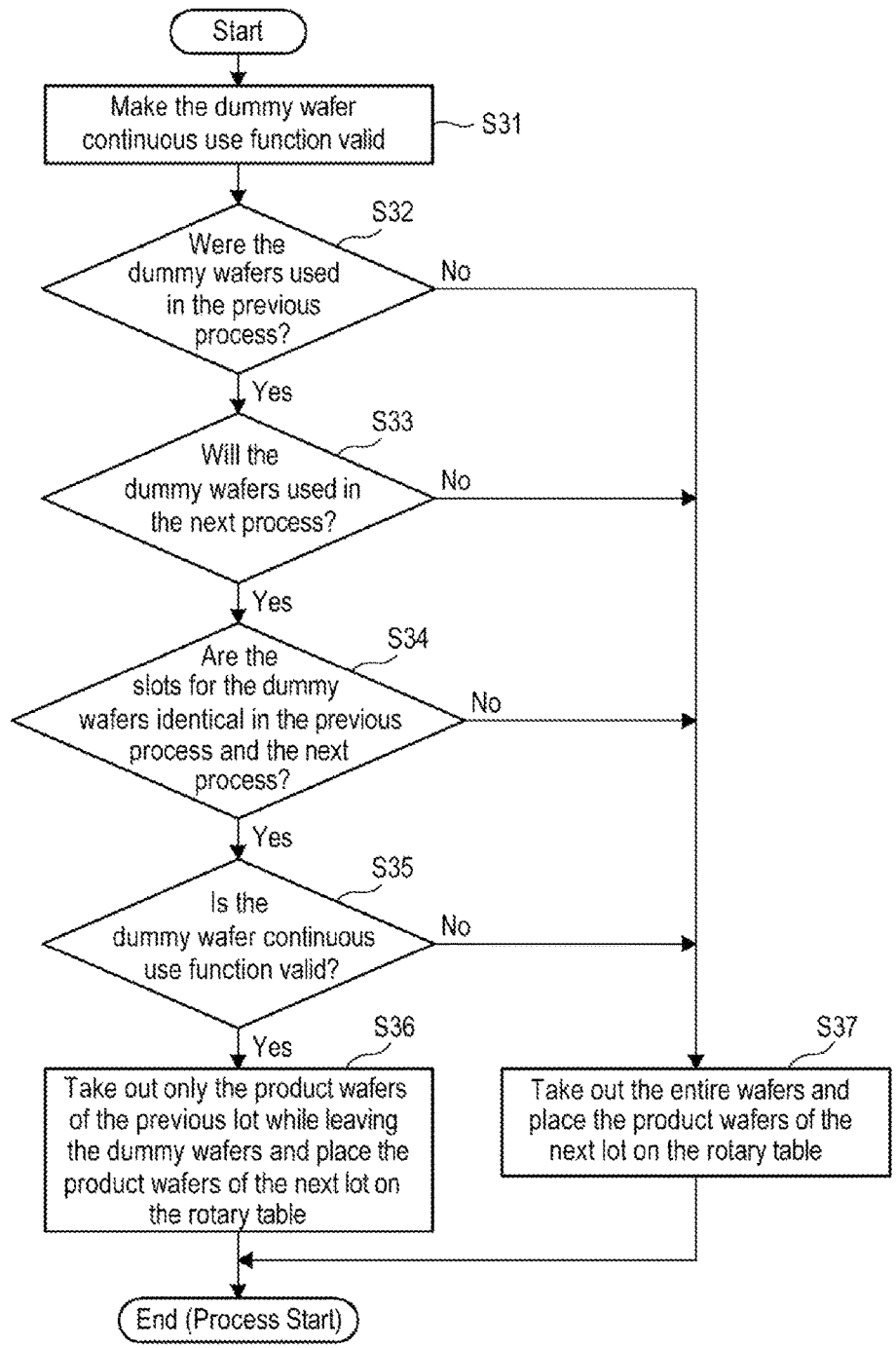
FIG. 24 is a flowchart showing a processing flow in said another example of the substrate processing apparatus.

More specifically, as shown in FIG. 23, a switching unit 100 configured to switch the validity and invalidity of a continuous use function of the dummy wafers W is installed in the input unit 77. Initially, as shown in FIG. 24, the switching unit 100 is switched to "valid" (Process S31). In the aforementioned example, the dummy wafers W are used in a first film forming process (Process S32). The dummy wafers W are also used in a second subsequent film forming process (Process S33). In the first film forming process and the second film forming process, the slots 20 receiving the dummy wafers W are consistently used (Process S34) and the switching unit 100 is kept valid (Process S35). Thus, the following operation is performed.

Figure 13:
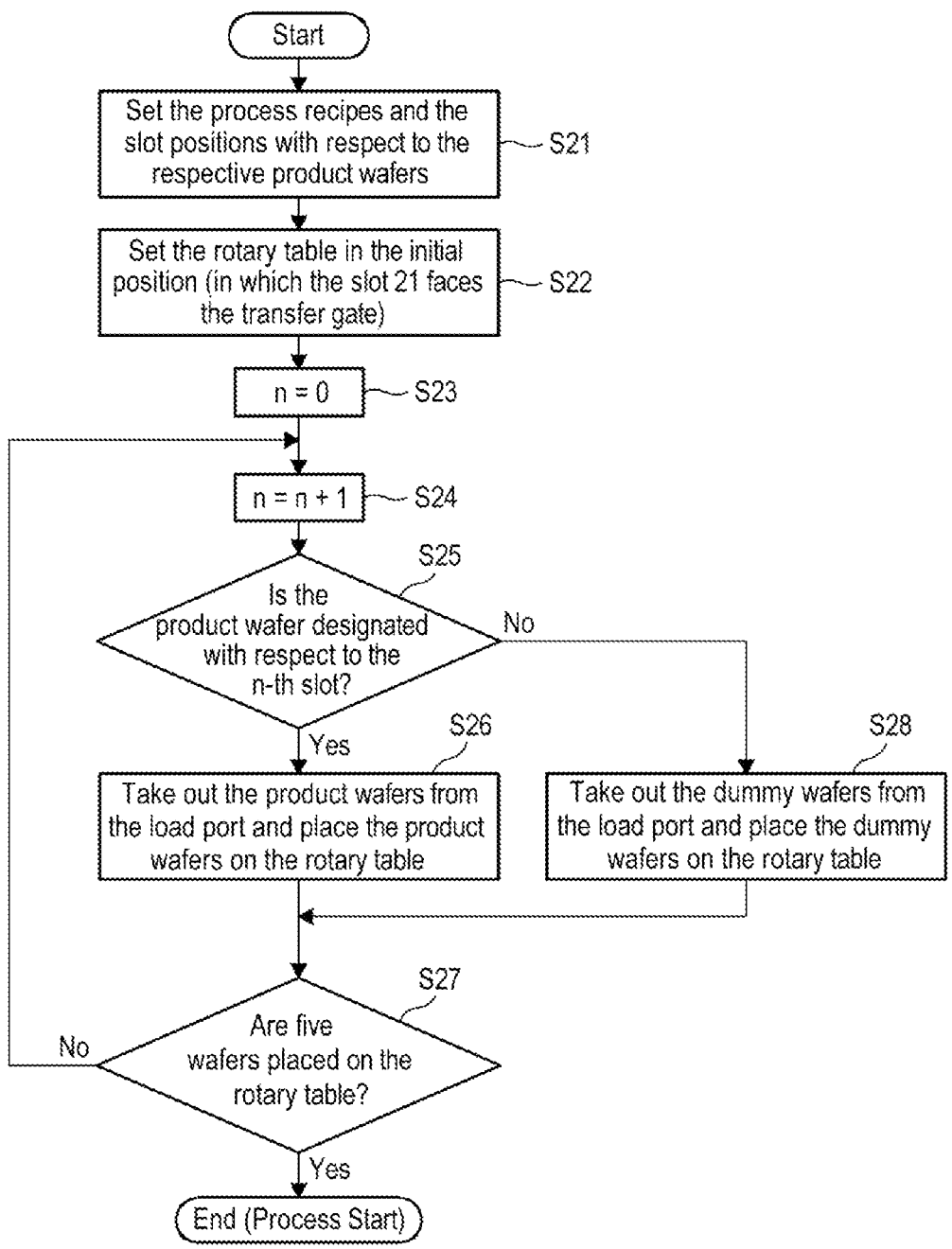
FIG. 13 is a flowchart showing a substrate processing flow in the substrate processing apparatus.
Figure 25:
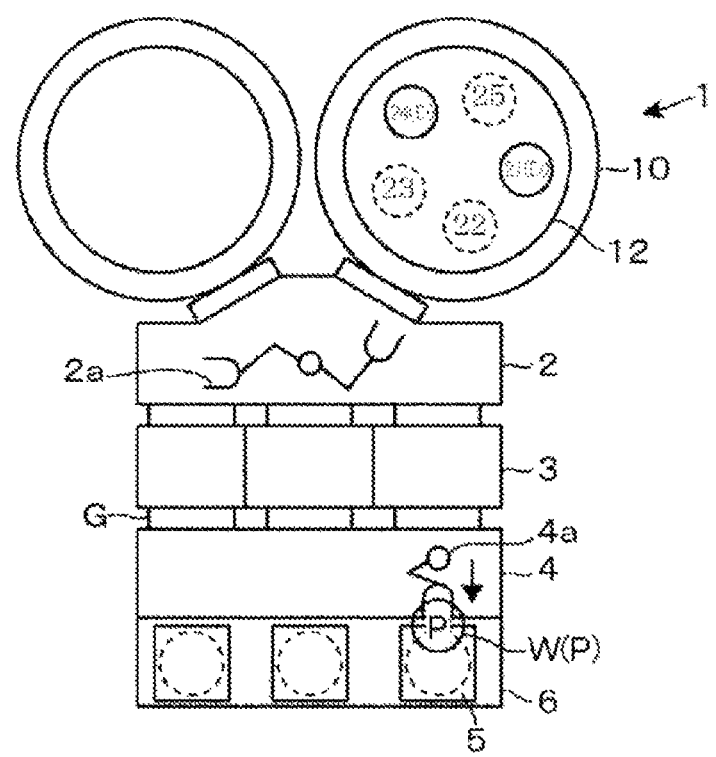
FIG. 25 is a schematic diagram showing an operation of said another example of the substrate processing apparatus.
Figure 26:
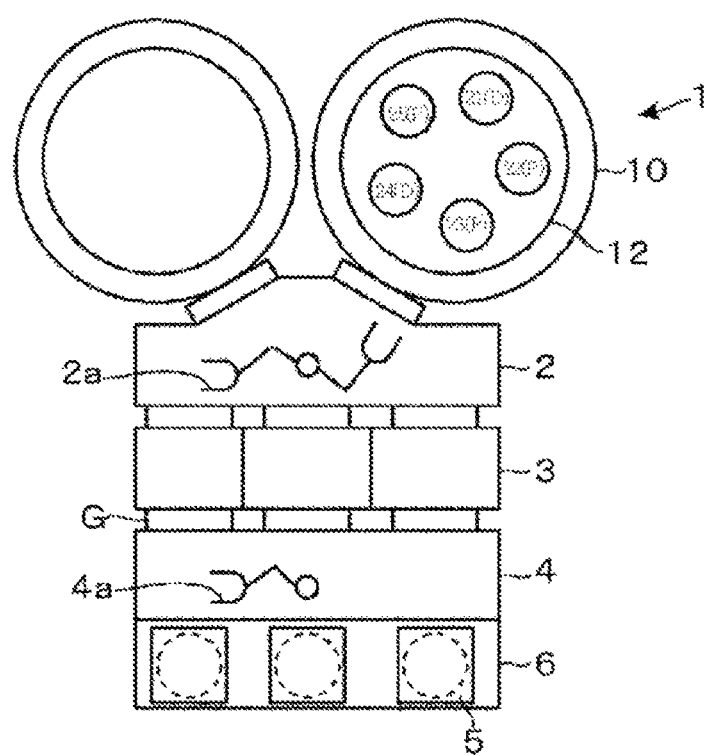
FIG. 26 is a schematic diagram showing an operation of said another example of the substrate processing apparatus.

More specifically, as shown in FIG. 25, when one film forming process is finished, the product wafers W are returned to the original transfer container 5 while the dummy wafers W used in the first film forming process are left in the rotary table 12. Then, as shown in FIG. 26, the product wafers W to be used in the second subsequent film forming process are carried into the vacuum container 10. Thus, there is no need to move the dummy wafers W into the vacuum container 10 in the second film forming process. It is therefore possible to enhance the throughput. If the dummy wafers W are not used in either the first film forming process or the second film forming process, if the arrangement layouts of the dummy wafers W differ from each other in the first film forming process and the second film forming process, or if the switching unit 100 is switched to "invalid", the operation described with respect to FIG. 13 is performed (Process S37).

Figure 27:
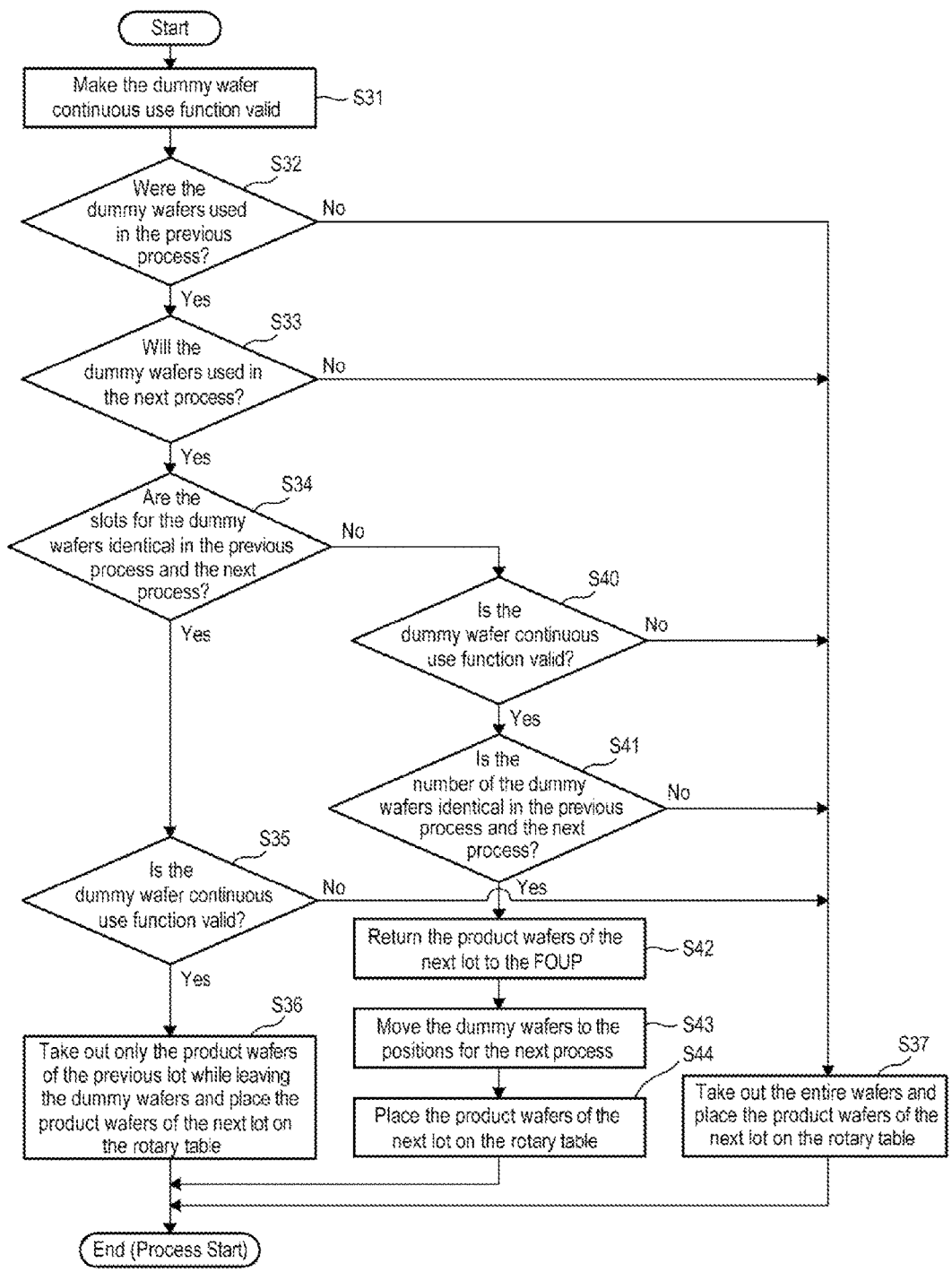
FIG. 27 is a flowchart showing a processing flow in a further example of the substrate processing apparatus.

The function of continuously using the dummy wafers W in the first film forming process and the second film forming process may be applied to not only a case where the arrangement layouts of the dummy wafers W are consistent in the first and second film forming processes but also a case where the number of the dummy wafers W is the same in the first and second film forming processes. This example will now be described with reference to FIGS. 27 to 29. The dummy wafers W are used in slots 21, 23 and 24 during the first film forming process but are used in slots 21, 22 and 24 during the second film forming process. In the first and second film forming processes, the positions of the dummy wafers W remain the same in slots 21 and 24 but differ in slots 22 and 23. In FIG. 27, the same processes as those shown in FIG. 24 will be designated by like reference symbols with no description made thereon.

In the aforementioned process S34, if the continuous use function of the dummy wafers W is valid when the slots 20 of the dummy wafers W differ in the first film forming process and the second film forming process (Process S40), the following method is employed. More specifically, if the number of dummy wafers W is consistent in the first and the second film forming processes (Process S41), the product wafers W used in the previous film forming process are first returned to the transfer container 5 (Process S42). Subsequently, the dummy wafers W are moved to the same slots 20 as used in the second film forming process.

Figure 28:
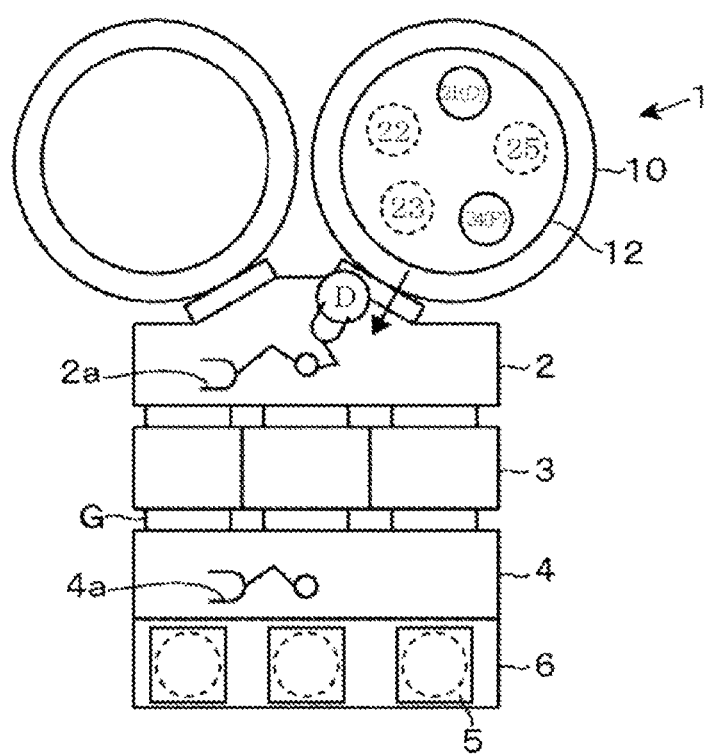
FIG. 28 is a schematic diagram showing an operation of said further example of the substrate processing apparatus.
Figure 29:
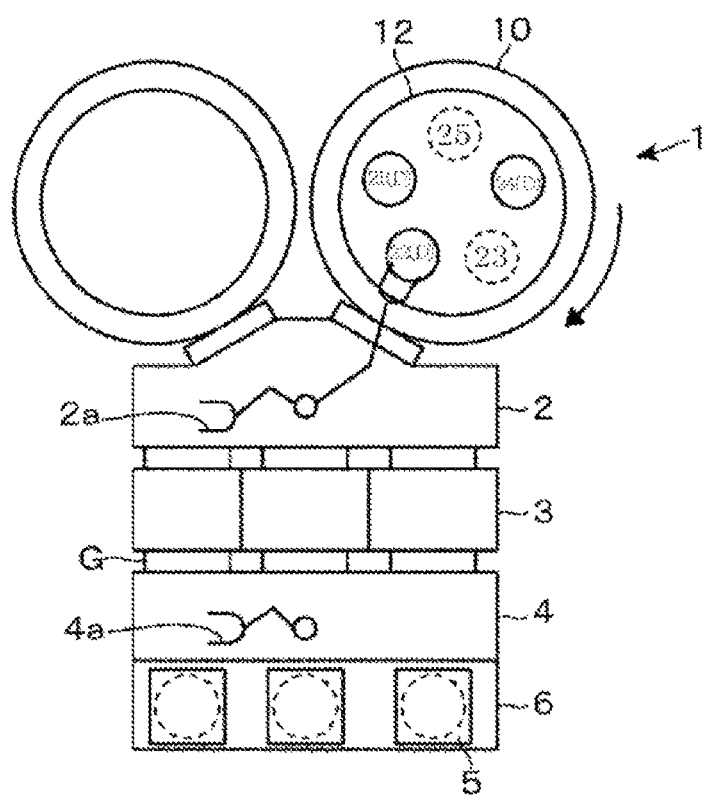
FIG. 29 is a schematic diagram showing an operation of said further example of the substrate processing apparatus.

More specifically, as shown in FIG. 28, the dummy wafer W in the slot 23 is taken out from the vacuum container 10 using the vacuum transfer arm 2a and is kept in a standby state within the vacuum transfer chamber 2. Then, as shown in FIG. 29, the rotary table 12 is rotated such that the slot 22 faces the transfer gate 19. The dummy wafer W on the vacuum transfer arm 2a is placed in the slot 22 (Process S43). Thereafter, the transfer of the product wafers W is started in the second film forming process (Process S44). When moving the dummy wafers W, a determination is made as to whether the arrangement positions of the respective dummy wafers W are identical with the arrangement positions in the previous film forming process. If the arrangement positions are identical, the carry-out/carry-in work of the dummy wafers W is not performed. If the arrangement positions are different, the dummy wafers W are moved to, e.g., the slots 20 closest to the slots 20 in which the dummy wafers W are placed.

In this operation method, the time required in returning the dummy wafers W from the vacuum transfer chamber 2 to the transfer container 5 and the time required in carrying the dummy wafers W from the transfer container 5 into the vacuum transfer chamber 2 become unnecessary. This leads to an increase of the throughput. When the dummy wafers W are continuously used in a first film forming process and a second film forming process as shown in FIGS. 24 to 27, the continuous use function may be automatically made valid without installing the switching unit 100.

If the dummy wafers W are used in a first film forming process and a second film forming process performed after the first film forming process as shown in FIGS. 24 to 27, the same operation method may be employed even if the arrangement layouts of the dummy wafers W and the number of the dummy wafers W are not consistent in the first and second film forming processes. More specifically, it may be possible to take an example in which two dummy wafers W are used in one film forming process while three dummy wafers W are used in another film forming process. In this case, the two dummy wafers W used in one film forming process are not returned to the transfer container 5 but are left on the rotary table 12 or kept in a standby state within the vacuum transfer chamber 2. Position adjustment is performed such that the arrangement layout of another film forming process becomes available. Then, one additional dummy wafer W is moved from the transfer container 5 to the rotary table 12. If there are three dummy wafers W being used in one film forming process while two dummy wafers W are used in another film forming process, one of the three dummy wafers W used in said one film forming process is returned to the transfer container 5. The remaining two dummy wafers W used in said one film forming process are not returned to the transfer container 5 but are left on the rotary table 12. Position adjustment is performed such that the arrangement layout of another film forming process becomes available.

Figure 30:
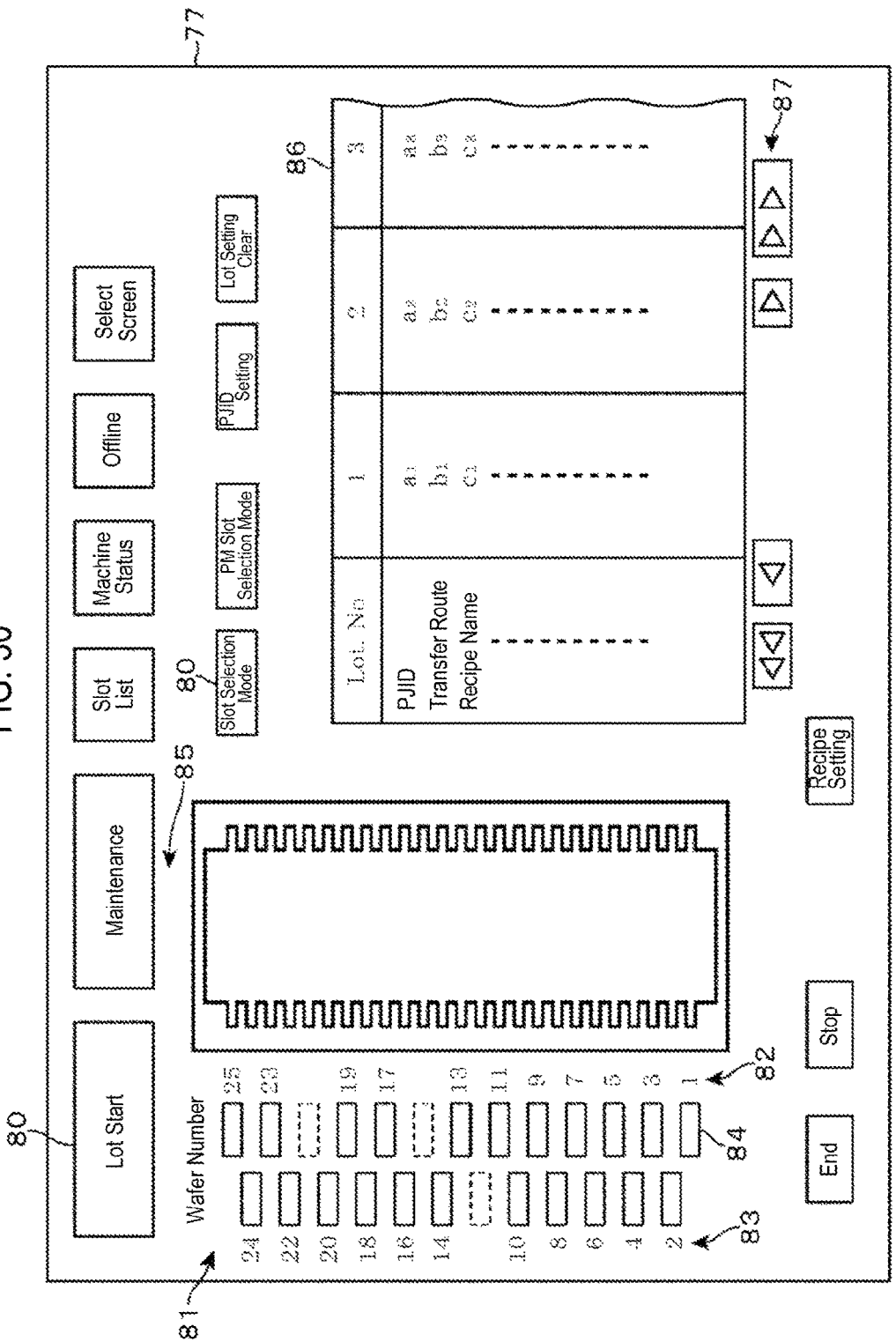
FIG. 30 is a schematic view showing one example of a screen displayed on an input unit in a still further example of the substrate processing apparatus.

In the description made above, the designation of the slots 20 as transfer destinations of the respective product wafers W in the input unit 77 is carried out before the transfer container 5 is placed in the load port 6. However, the designation of the slots 20 may be performed after the transfer container 5 is placed in the load port 6. In this case, the existence or absence of the wafers W within the transfer container 5 is determined using a determination mechanism such as a camera or an infrared emitting/receiving unit not shown. If the wafers W are not received within the transfer container 5, the slots 20 as transfer destinations may not be designated with respect to the empty positions. In FIG. 30, there is illustrated an example in which the wafers W are not received within the transfer container 5 in the twelfth, fifteenth and twenty first positions from the bottom and, therefore, the slots 20 as transfer destinations cannot be designated with respect to the three positions.

In the foregoing example, the wafer W is initially transferred to slot 21. As an alternative example, the transfer of the wafers W may be started from slot 22 and, then, the wafers W may be transferred one after another along the circumferential direction of the rotary table 12. Moreover, the transfer of the wafers W may be started from slot 20 which is positioned to face the transfer gate 19 when the rotary table 12 is stopped. More specifically, when a film forming process is finished with respect to a certain lot, the wafers W are taken out from slots 21 to 25 one after another. If the rotary table 12 becomes empty, slot 25 faces the transfer gate 19. Therefore, the transfer of the wafers W may be started from slot 25 in the next lot.

In addition, the transfer order of the wafers W may be randomly set. More specifically, the wafer W may be first transferred to, e.g., slot 22. Subsequently, the wafers W may be transferred in the order to slots 24, 21, 25 and 23. If the transfer order of the wafers W is made random in this manner, for example, the lowermost wafer W contained within the transfer container 5 may be first transferred.

Subsequently, the wafer W disposed above the lowermost wafer W may be transferred. In this way, the wafers W disposed in the upper positions may be transferred one after another.

In the foregoing example, the present disclosure is applied to the method in which the product wafers W are transferred to specific slots 20 while the dummy wafers W are transferred to the slots 20 other than the specific slots 20. However, the present disclosure may be applied to a case where a film forming process is performed with respect to five product wafers W. More specifically, after forming thin films on the five product wafers W, a film forming process may be performed such that thin films having an increased thickness are formed on, e.g., the product wafers W placed in the slots 22 and 25. In this case, after forming thin films on the five product wafers W and before performing the subsequent film forming process, the product wafers W are carried out from the slots 21, 23 and 24 and the dummy wafers W are transferred to the slots 21, 23 and 24. According to this operation method, thin films differing in thickness from one another can be formed on a plurality of wafers W while using one and the same process module 1.

In the aforementioned example, the film forming process is performed under a vacuum environment within the process module 1. However, the film forming process may be performed under an atmospheric environment. In this case, the process module 1 is connected to the atmospheric transfer chamber 4. While the film forming process is taken as an example of the process performed in the process module 1, it may be possible to perform a plasma process. More specifically, instead of the respective nozzles 31, 32, 41 and 42, a nozzle may be used to supply a plasma generating gas (e.g., an argon gas) and a pair of parallel electrodes may be used to turn the gas injected from the nozzle to plasma. As an alternative example, plasma may be supplied to the wafers W on which thin films are formed, thereby reforming the thin films with the plasma. In this case, the dummy wafers W are placed in the slots 20 in which the product wafers W are not placed. This makes it possible to restrain the bottom surfaces of the respective slots 20 from being damaged by the plasma.

According to the present disclosure, a process is performed using a substrate processing apparatus provided with a rotary table in which a plurality of placing regions is arranged along a circumferential direction of a processing container. At this time, at least one of the placing regions is previously designated as a product wafer transfer destination placing region. When designating a placing region as a transfer destination of a product wafer, a determination is made of which of the product wafers contained in a transfer container are to be transferred. A product wafer is placed in said at least one placing region and dummy wafers are placed in all the remaining regions. Thus, it is possible to place product wafers in the placing regions in which a process needs to be performed, and to place dummy wafers in the remaining placing regions in which a process need not be performed. Accordingly, a film forming process can be performed in an arbitrary placing region while suppressing unnecessary consumption of product wafers and suppressing formation of thin films in the remaining placing regions.

While certain embodiments have been described, these embodiments have been presented by way of example only, and are not intended to limit the scope of the disclosures. Indeed, the novel apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process module including a processing container;
a rotary table installed within the processing container and configured to rotate about a vertical axis, the rotary table having a plurality of placing regions formed along a circumferential direction thereof so as to receive substrates, and a process gas supply unit configured to supply a process gas to the placing regions so as to process the substrates;
a load port in which a transfer container containing product substrates is placed;
a dummy substrate receiving unit in which dummy substrates are received;
a transfer chamber including a transfer mechanism configured to deliver the product substrates or the dummy substrates between the transfer container on the load port or the dummy substrate receiving unit and the rotary table;
a setting unit configured to set at least one placing region to which at least one of the product substrates contained in the transfer container is to be transferred, among the plurality of placing regions of the rotary table; and
a control unit configured to output a first control signal to the transfer chamber based on a setting result of the setting unit to carry out a method comprising delivering, by the transfer mechanism, the at least one of the product substrates into the at least one placing region and the dummy substrates into remaining placing regions other than the at least one placing region among the plurality of placing regions,
wherein the control unit outputs a second control signal based on a setting result of the setting unit such that, when finishing one process and starting another subsequent process in the process module, in response to consistency of arrangement layouts of the dummy substrates on the rotary table in said one process and said another process, the product substrates used in said one process are carried out from the processing container and, then, the product substrates used in said another subsequent process are carried into the processing container while the dummy substrates used in said one process are kept in place on the rotary table.

2. The apparatus of claim 1, further comprising:
a mode selection unit configured to select a first transfer mode and a second transfer mode, and
wherein the first transfer mode is a mode in which a control signal is outputted such that the product substrates contained in the transfer container are transferred to the placing regions one after another without using the setting unit and in which the placing regions are filled with the dummy substrates when the number of the product substrates is less than the number of the placing regions, and the second transfer mode is a mode in which a setting screen corresponding to the setting unit is displayed and in which contents set by the setting screen become valid.

3. The apparatus of claim 1, further comprising:
another process module connected to the transfer chamber, said another process module including a processing container, a rotary table installed within the processing container and configured to rotate about a vertical axis, the rotary table having a plurality of placing regions formed along a circumferential direction thereof so as to receive substrates, and a process gas supply unit configured to supply a process gas to the placing regions so as to process the substrates, and wherein the setting unit is configured to interrelate at least one of the product substrates with one of the placing regions of one of the process module and said another process module.

4. The apparatus of claim 1, wherein the setting unit includes a switching unit configured to switch the validity and invalidity of a function in which, in response to consistency of the arrangement layouts of the dummy substrates on the rotary table in said one process and said another process performed in the process module, the product substrates used in said one process are carried out from the processing container and, then, the product substrates used in said another process are carried into the processing container while the dummy substrates used in said one process are kept in place on the rotary table.

5. The apparatus of claim 1, wherein the control unit is configured to output a control signal to the transfer chamber based on a setting result of the setting unit to carry out a method comprising delivering, by the transfer mechanism, the product substrates or the dummy substrates into the plurality of placing regions one after another along the circumferential direction of the rotary table.

* * * * *